United States Patent
Tsujino et al.

(10) Patent No.: US 8,780,101 B2
(45) Date of Patent: Jul. 15, 2014

(54) PHOTOSENSOR OPERATING IN ACCORDACNE WITH SPECIFIC VOLTAGES AND DISPLAY DEVICE INCLUDING SAME

(75) Inventors: Sachio Tsujino, Osaka (JP); Yousuke Nakagawa, Osaka (JP); Kazuhiro Maeda, Osaka (JP); Ichiroh Shiraki, Osaka (JP); Hiroaki Sugiyama, Osaka (JP); Nobuhiro Kuwabara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 217 days.

(21) Appl. No.: 13/391,654

(22) PCT Filed: Jul. 12, 2010

(86) PCT No.: PCT/JP2010/061792
§ 371 (c)(1),
(2), (4) Date: Feb. 22, 2012

(87) PCT Pub. No.: WO2011/024571
PCT Pub. Date: Mar. 3, 2011

(65) Prior Publication Data
US 2012/0154354 A1 Jun. 21, 2012

(30) Foreign Application Priority Data
Aug. 26, 2009 (JP) .................................. 2009-195801

(51) Int. Cl.
*G09G 5/00* (2006.01)

(52) U.S. Cl.
USPC ....................................................... 345/207

(58) Field of Classification Search
USPC ................... 345/174–178, 207; 349/50, 116; 250/205, 208.1, 208.2, 214.1, 214 AL, 250/215
See application file for complete search history.

(56) References Cited

U.S. PATENT DOCUMENTS

| 2006/0033729 | A1 | 2/2006 | Yoshida et al. |
| 2009/0166510 | A1* | 7/2009 | Park et al. ...................... 250/205 |
| 2010/0308212 | A1* | 12/2010 | Tanaka et al. .............. 250/214.1 |
| 2010/0321355 | A1 | 12/2010 | Gotoh et al. |
| 2011/0043471 | A1* | 2/2011 | Senda et al. .................. 345/173 |
| 2012/0242621 | A1* | 9/2012 | Brown et al. ................. 345/175 |

FOREIGN PATENT DOCUMENTS

| JP | 05-284279 A | 10/1993 |
| JP | 2002-182839 A | 6/2002 |

(Continued)

OTHER PUBLICATIONS

Official Communication issued in International Patent Application No. PCT/JP2010/061792, mailed on Aug. 10, 2010.

*Primary Examiner* — Chanh Nguyen
*Assistant Examiner* — Jonathan Blancha
(74) *Attorney, Agent, or Firm* — Keating & Bennett, LLP

(57) ABSTRACT

By reducing the potential drop of a storage node that occurs due to feedthrough, the capacitance of a storage capacitor is reduced and sensor sensitivity is improved. In a photosensor, the first terminal of a storage capacitor (C2) and the gate of a MOS transistor (M1), which outputs a signal in accordance with the potential of a storage node (N2), are connected to the storage node (N2). A forward biased pulse voltage is supplied to the anode of a first photodiode (DS) in a reset period, and a reverse biased voltage is supplied to the anode of the first photodiode in a storage period and a readout period. A reverse biased voltage is supplied to the anode of a second photodiode (DM) in all operation periods. A voltage that keeps the potential of the storage node lower than the threshold value of the MOS transistor (M1) is supplied to the second terminal of the storage capacitor in the reset period and the storage period, and a voltage that thrusts the potential of the storage node (N2) upward to the threshold value of the MOS transistor (M1) or higher is supplied to the second terminal of the storage capacitor in the readout period.

13 Claims, 21 Drawing Sheets

(56) References Cited

FOREIGN PATENT DOCUMENTS

| JP | 2006-053663 A | 2/2006 |
| JP | 2006-244407 A | 9/2006 |
| JP | 2009-540396 A | 11/2009 |
| WO | 2007/145346 A1 | 12/2007 |
| WO | 2007/145347 A1 | 12/2007 |
| WO | 2009/098994 A1 | 8/2009 |

* cited by examiner

US 8,780,101 B2

PHOTOSENSOR OPERATING IN ACCORDACNE WITH SPECIFIC VOLTAGES AND DISPLAY DEVICE INCLUDING SAME

TECHNICAL FIELD

The present invention relates to a photosensor that detects the amount of light received using a photodiode, and a display device including the photosensor in a pixel region.

BACKGROUND ART

Liquid crystal display devices, organic EL displays, and the like are known as display devices for various types of equipment such as notebook computers and mobile phones. Generally, in a display device, pixel regions are provided at intersections between scanning lines and signal lines, and disposed in each pixel region are, for example, display elements such as pixel electrodes, and thin film transistors for driving.

A configuration for detecting the amount of light received has been proposed in which photosensors that employ a photodetection element such as a photodiode are disposed in alignment with the display elements in the pixel region in such a display device (e.g., JP 2002-182839A and WO 2007/145346). Such a configuration enables detecting the brightness of external light and picking up an image of an object that has come close to the reading surface.

In a conventional liquid crystal display device including this type of photosensor, a MOS image sensor is configured by disposing photosensors in alignment with liquid crystal pixel portions arranged at intersections between scanning lines and signal lines. The photosensors configuring the MOS image sensor each include a photodiode, a storage capacitor that stores a charge in accordance with the amount of light received by the photodiode, a MOS transistor, and various types of control lines for controlling the operations of these members. In the photosensors, switching of the MOS transistor and the like is performed using a signal supplied from a control line, thus controlling the resetting of the charge of the storage capacitor and the reading out of charge from the storage capacitor.

FIG. 12 shows the configuration of the photosensor disclosed in JP 2002-182839A. The cathode of a photodiode DL is connected to a storage node N1. Furthermore, a first terminal of a storage capacitor C1 and the gate of a MOS transistor M1 are connected to the storage node N1. The anode of the photodiode DL is connected to a reset control line RST. A second terminal of the storage capacitor C1 is connected to a readout control line RS. A voltage VDD is supplied to the source of the MOS transistor M1 during signal readout, and the drain of the MOS transistor M1 is connected to a signal readout line SL. This photosensor can be disposed with a small occupied area due to the ability to operate with only one MOS transistor M1.

A description will now be given of operations of the photosensor shown in FIG. 12, with reference to FIG. 13. In FIG. 13, (a) shows a waveform of change in the potential of the storage node N1 that accompanies change in signals. In FIG. 13, (b) shows a voltage waveform of the reset signal supplied to the reset control line RST, and (c) shows a voltage waveform of the readout signal applied to the readout control line RS. This photosensor operates by the repetition of a cycle including a reset period, a storage period, and a readout period.

First, at the start of the reset period, as shown in (b) of FIG. 13, the reset signal of the reset control line RST transitions from low level $V_{RST}L$ to high level $V_{RST}H$. At this time, as shown in (c) of FIG. 13, the readout signal of the readout control line RS is in the low level $V_{RS}L$ state. Accordingly, the photodiode DL enters the forward biased state, and a voltage at high level $V_{RST}H$ is applied to the storage capacitor C1 via the storage node N1. As a result, in the reset period, the storage capacitor C1 is charged and enters a pre-charged state, and as shown in (a) of FIG. 13, the potential of the storage node N1 reaches $V_{RST}H$. Here, $V_{RST}H$ is set so as to be lower than the threshold voltage of the MOS transistor M1. Accordingly, the MOS transistor M1 is in the off state in the reset period and the subsequent storage period.

Thereafter, when the reset signal returns to low level $V_{RST}L$ as shown in (b) of FIG. 13, the photodiode DL enters the reverse biased state, and the storage period is started. Instantly at this time, the charge of the storage capacitor C1 is partially discharged via the parasitic capacitance of the photodiode DL, and as shown in (a) of FIG. 13, the potential of the storage node N1 drops by a constant voltage ($V_{FD}1$) to $V_{N1}0$. This phenomenon is called "feedthrough".

In the storage period, current flows from the storage node N1 to the reset control line RST via the photodiode DL due to charge generated in accordance with the amount of light received by the photodiode DL. Then, as shown in (a) of FIG. 13, the potential of the storage node N1 gradually decreases from $V_{N1}0$, and reaches $V_{N1}1$ at the end of the storage period. This potential $V_{N1}1$ of the storage node N1 is also set so as to not exceed the threshold voltage of the MOS transistor M1.

When the readout period starts, as shown in (c) of FIG. 13, the voltage of the readout signal rises to high level $V_{RS}H$, and VDD is supplied to the source of the MOS transistor M1. Due to the readout signal reaching high level $V_{RS}H$ as described above, charge implantation occurs via the storage capacitor C1, and as shown in (a) of FIG. 13, the potential of the storage node N1 rises to a readout potential $V_{G1}$. Since the potential $V_{G1}$ is set so as to exceed the threshold voltage of the MOS transistor M1, the MOS transistor M1 is turned on, and an output signal that is in accordance with the potential of the storage node N1 is read out via the signal readout line SL.

When the readout period ends, as shown in (c) of FIG. 13, the readout signal returns to low level $V_{RS}L$, and the source of the MOS transistor M1 is cut off from VDD. Accordingly, the charge in the storage node N1 is discharged via the storage capacitor C1, and the potential of the storage node N1 returns to the value $V_{N1}1$, which is lower than the threshold voltage of the MOS transistor M1.

According to the above operations, in the reset period, the storage node N1 is reset (pre-charged) via the photodiode DL. Then, in the storage period, the potential of the storage node N1 changes in accordance with the charge generated in the photodiode DL. In the readout period, the change in the potential of the storage node N1 is readout by the MOS transistor M1, thus obtaining photodetection output.

DISCLOSURE OF INVENTION

High level $V_{RS}H$ of the readout signal that is applied in the readout period of the photosensor shown in FIG. 12 is set such that the potential of the storage node N1 thrusts upward high above the threshold voltage of the MOS transistor M1. On the other hand, the potential $V_{G1}$ of the storage node N1 is reached as a result of the potential $V_{N1}1$ of the storage node N1, which changes in accordance with the amount of light received, being raised by the readout signal $V_{RS}H$, and therefore the sensitivity range of the photodiode DL fluctuates.

For this reason, the value of the readout signal $V_{RS}H$ is set such that the potential $V_{G1}$ of the storage node N1 during readout falls within a range in which the MOS transistor M1 is driven in the linear region. Specifically, high level $V_{RS}H$ of the readout signal is set also in consideration of the fact that the MOS transistor M1 is to be driven in the region in which change in the drain voltage relative to the gate voltage is linear. This facilitates the processing of the output signal as well as facilitates ensuring the dynamic range of the output of the MOS transistor M1.

The amount by which the potential of the storage node N1 is to be thrust upward is dependent on the amount of charge that is implanted by the readout signal $V_{RS}H$ via the storage capacitor C1. The higher a capacitance C1 of the storage capacitor C1, the higher the voltage value reached in the upward thrust by the same level of readout signal $V_{RS}H$. Accordingly, a higher capacitance C1 of the storage capacitor C1 is advantageous since the level of the readout signal $V_{RS}H$ can be lower.

However, as the capacitance C1 of the storage capacitor C1 increases, a capacitance $C_{N1}$ of the storage node N1 represented by the following expression increases. $C_{DL}$ is the parasitic capacitance of the photodiode DL, and $C_{M1}$ is the gate capacitance of the MOS transistor M1.

$$C_{N1} = C_1 + C_{DL} + C_{M1}$$

As the capacitance $C_{N1}$ of the storage node N1 increases, the amount of change in the potential of the storage node N1, which is attributed to the amount of charge generated in the photodiode DL, decreases, and the sensor sensitivity decreases. The reason for this is as follows. Specifically, increasing the sensor sensitivity requires an increase in the range of the potential of the storage node N1. The range of the potential of the storage node N1 is determined by a maximum value Q2 and a minimum value Q1 of the amount of charge when charge in the storage node N1 flows to the reset control line RST via the photodiode DL in the storage period.

The range of the potential of the storage node N1 is the range from the potential $V_{N1}2$ of the storage node N1 when the amount of charge is the maximum value Q2 to the potential $V_{N1}1$ of the storage node N1 when the amount of charge is the minimum value Q1, and is represented by the following expression. Q0 is the amount of charge corresponding to the potential $V_{N1}0$ of the storage node N1 immediately after the occurrence of feedthrough.

$$\text{Storage node voltage range} = V_{N1}1 - V_{N1}2$$
$$= (Q0 - Q1)/C_{N1} - (Q0 - Q2)/C_{N1}$$
$$= (Q2 - Q1)/C_{N1}$$

In other words, in order to obtain a high sensor sensitivity, it is desirable to reduce the capacitance $C_{N1}$ of the storage node, and therefore it is desirable that the capacitance C1 of the storage capacitor C1 is low.

Also, the appropriate magnitude of high level $V_{RS}H$ of the readout signal is dependent on the potential $V_{N1}0$ of the storage node N1 at the start of the storage period. Accordingly, this appropriate magnitude is influenced by the amount of drop in the potential of the storage node N1 due to feedthrough. In other words, the smaller the drop in the potential of the storage node N1 due to feedthrough, the lower the value of high level $V_{RS}H$ of the readout signal can be.

In consideration of the above points, a photosensor that can reduce the capacitance of the storage capacitor and improve sensor sensitivity by reducing the drop in the storage node potential due to feedthrough, and a display device using the photosensor are provided.

A photosensor according to an embodiment of the present invention includes: a first photodiode and a second photodiode; a storage node to which cathodes of the first and second photodiodes are connected; a storage capacitor, a first terminal of which is connected to the storage node; and a MOS transistor, a gate of which is connected to the storage node, that outputs a signal in accordance with the potential of the storage node, wherein, a forward biased pulse voltage is supplied to an anode of the first photodiode in a reset period, and a reverse biased voltage is supplied to the anode of the first photodiode in a storage period and a readout period, a reverse biased voltage is supplied to an anode of the second photodiode in all operation periods, and a voltage that holds the potential of the storage node lower than a threshold value of the MOS transistor is supplied to a second terminal of the storage capacitor in the reset period and the storage period, and a voltage that thrusts the potential of the storage node upward to a range greater than or equal to the threshold value of the MOS transistor is supplied to the second terminal of the storage capacitor in the readout period.

According to this embodiment of the present invention, the parasitic capacitance of the photodiode that contributes to feedthrough is reduced by supplying a reset voltage to the storage node via a portion of multiple photodiodes into which a photodiode has been divided. Accordingly, the voltage drop of the storage node due to feedthrough is reduced, thus enabling reducing the capacitance value of the storage capacitance and improving the sensor sensitivity.

DESCRIPTION OF THE INVENTION

Figure 1:
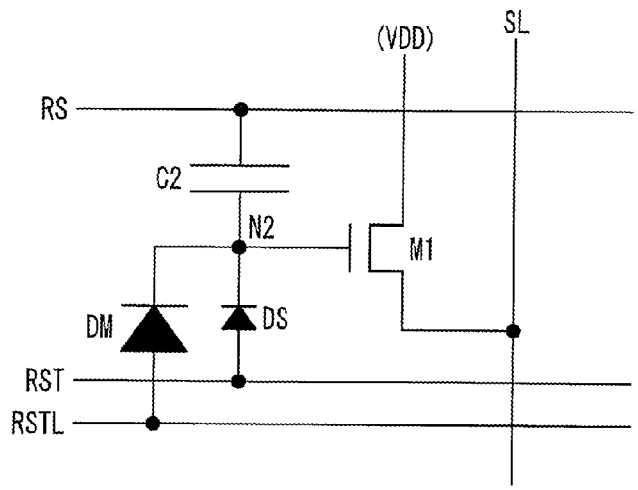
FIG. 1 is a circuit diagram showing a configuration of a photosensor according to a first embodiment of the present invention.

A photosensor according to an embodiment of the present invention includes: a first photodiode and a second photodiode; a storage node to which cathodes of the first and second photodiodes are connected; a storage capacitor, a first terminal of which is connected to the storage node; and a MOS transistor, a gate of which is connected to the storage node, that outputs a signal in accordance with the potential of the storage node, wherein, a forward biased pulse voltage is supplied to an anode of the first photodiode in a reset period, and a reverse biased voltage is supplied to the anode of the first photodiode in a storage period and a readout period, a reverse biased voltage is supplied to an anode of the second photodiode in all operation periods, and a voltage that holds the potential of the storage node lower than a threshold value of the MOS transistor is supplied to a second terminal of the storage capacitor in the reset period and the storage period, and a voltage that thrusts the potential of the storage node upward to a range greater than or equal to the threshold value of the MOS transistor is supplied to the second terminal of the storage capacitor in the readout period (first configuration).

According to the above configuration, the parasitic capacitance of the first photodiode is lower than that of a conventional configuration in which one photodiode is provided. For this reason, the voltage drop that accompanies feedthrough after the reset period is smaller than in conventional technology due to the influence of the parasitic capacitance of the first photodiode. Reducing the voltage drop that accompanies feedthrough in this way enables reducing the voltage necessary for thrusting the potential of the storage node upward. In other words, according to the above-described configuration, it is possible to reduce the voltage for thrusting the potential of the storage node upward via the storage capacitor in the readout period, thus enabling reducing the capacitance of the storage capacitor. This improves the sensor sensitivity.

In the first configuration, it is preferable that a parasitic capacitance of the first photodiode is lower than that of the second photodiode (second configuration).

Reducing the parasitic capacitance of the first photodiode in this way enables commensurately reducing the voltage drop due to feedthrough. Accordingly, it is possible to reduce the capacitance of the storage capacitor and improve the sensor sensitivity.

In the first or second configuration, a configuration is preferable in which the reverse biased voltage supplied to the anode of the second photodiode is the same as the reverse biased voltage supplied to the anode of the first photodiode (third configuration).

This enables always keeping the second photodiode in the reverse biased state. Accordingly, whereas the second photodiode serves the role of allowing the flow of a charge in accordance with the amount of light received in the storage period, feedthrough occurs immediately after the reset period due to the parasitic capacitance of the first photodiode. This enables reducing the voltage drop due to feedthrough compared to a conventional configuration, and enables reducing the capacitance of the storage capacitor.

In any one configuration among the first to third configurations, it is preferable that the voltage supplied to the second terminal of the storage capacitor in the readout period is set such that the potential of the storage node is limited to a range in which the MOS transistor operates in a linear region (fourth configuration).

According to this configuration, it is possible to cause the MOS transistor to operate in the linear region.

In any one configuration among the first to fourth configurations, it is preferable that the anode of the first photodiode is connected to a reset control line via which the forward biased pulse voltage is supplied in the reset period, the anode of the second photodiode is connected to a reverse biased voltage supply line via which a reverse biased voltage is supplied in all operation periods, and in the readout period, the second terminal of the storage capacitor is connected to a readout control line via which the voltage according to which the potential of the storage node is thrust upward to the threshold value of the MOS transistor or greater is supplied (fifth configuration).

A display device according to an embodiment of the present invention includes: a display panel having a pixel region in which a plurality of pixel blocks are arranged; and a driving circuit that performs signal processing for driving an element configuring the pixel region, wherein each of the pixel blocks includes a display portion configured by a display element, and a photosensor portion for detecting incident light, and each of the photosensor portions is configured by the photosensor according to any one of claims 1 to 5 (sixth configuration).

In the sixth configuration, each of the pixel blocks may include one display portion and one photosensor portion, and each of the photosensor portions may include one first photodiode, one second photodiode, one storage capacitor, and one MOS transistor (seventh configuration). Alternatively, each of the photosensor portions may include one first photodiode, one second photodiode, two storage capacitors, and one MOS transistor (eighth configuration).

Also, in the sixth configuration, each of the pixel blocks may include two display portions and one photosensor portion, and each of the photosensor portions may include one first photodiode, four second photodiodes, five storage capacitors, and one MOS transistor (ninth configuration). Alternatively, each of the photosensor portions may include two first photodiodes, three second photodiodes, five storage capacitors, and one MOS transistor (tenth configuration). According to this configuration, there are two first photodiodes, thus improving resetting performance and enabling resetting to be performed in a short time period. Alternatively, each of the photosensor portions may include one first photodiode, three second photodiodes, four storage capacitors, and two MOS transistors (eleventh configuration). According to this configuration, there are two MOS transistors that output a signal in the readout period, thus enabling shortening the readout time.

Also, in the sixth configuration, a configuration is possible in which each of the pixel blocks includes four display portions and one photosensor portion, and each of the photosensor portions includes two first photodiodes, eight second photodiodes, ten storage capacitors, and two MOS transistors (twelfth configuration).

Also, in any one configuration among the sixth to twelfth configurations, a configuration is possible in which each of the display portions includes three primary color display elements (thirteenth configuration).

Below is a description of more specific embodiments with reference to the drawings.

Also, for the sake of convenience in the description, the drawings that are referenced below show simplifications of, among the constituent members of the embodiments, only relevant members that are necessary for the description. Accordingly, a display device according to the embodiments may include arbitrary constituent members that are not shown in the drawings referenced in this specification. Also, regarding the dimensions of the members in the drawings, the dimensions of the actual constituent members, the ratios of the dimensions of the members, and the like are not shown faithfully.

First Embodiment

Figure 2:
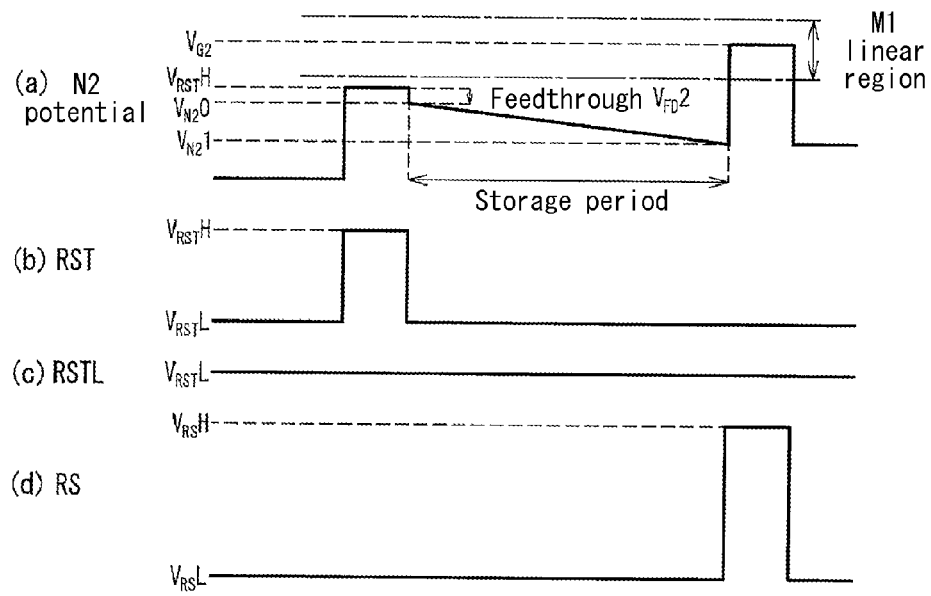
FIG. 2 is a waveform diagram for illustrating operations of the photosensor according to the first embodiment of the present invention.

The following describes a photosensor of a first embodiment with reference to FIGS. 1 and 2. FIG. 1 is a circuit diagram showing the configuration of the photosensor, and FIG. 2 is a waveform diagram showing operations of the photosensor. With the exception of the photodiodes, the basic configuration of this photosensor is similar to that in the case of the conventional example shown in FIG. 12. In the configuration in FIG. 1, the photodiode DL in FIG. 12 has been provided separated into a first photodiode DS and a second photodiode DM. The first photodiode DS is formed so as to have lower performance than that of the second photodiode. Here, photodiode performance means the ability of a photodiode to allow a charge to flow in the reverse biased state in the later-described storage period, that is to say, the size of a photodiode. Since photodiode performance corresponds to the parasitic capacitance of a photodiode, the parasitic capacitance of the first photodiode DS is lower than the parasitic capacitance of the second photodiode.

In the following description, the same reference signs have been given to elements similar to those in the conventional example shown in FIG. 12, and descriptions will not be given for some redundant portions.

In this photosensor, the cathodes of the first and second photodiodes DS and DM are both connected to a storage node N2. Furthermore, a first terminal of a storage capacitor C2 and the gate of a MOS transistor M1 are connected to the storage node N2. The anode of the first photodiode DS is connected to a reset control line RST. The anode of the second photodiode DM is connected to a reverse biased voltage supply line RSTL. A second terminal of the storage capacitor C2 is connected to a readout control line RS. A voltage VDD is supplied to the source of the MOS transistor M1 during signal readout. The drain of the MOS transistor M1 is connected to a signal readout line SL.

A description will now be given of operations of the photosensor shown in FIG. 1, with reference to FIG. 2. In FIG. 2, (a) shows a waveform of the potential of the storage node N2 that accompanies change in signals. In FIG. 2, (b) shows a voltage waveform of the reset signal supplied from the reset control line RST. In FIG. 2, (c) shows a waveform of the reverse biased voltage supplied from the reverse biased voltage supply line RSTL. In FIG. 2, (d) shows a voltage waveform of the readout signal applied from the readout control line RS. The photosensor repeatedly performs the operations of a reset period, a storage period, and a readout period.

First, at the start of the reset period, as shown in (b) of FIG. 2, the voltage applied to the first photodiode DS by the reset signal of the reset control line RST changes from low level $V_{RST}L$ to high level $V_{RST}H$. At this time, as shown in (d) of FIG. 2, the readout signal of the readout control line RS is in the low level $V_{RS}L$ state. Accordingly, the first photodiode DS enters the forward biased state. Note that as shown in (C) of FIG. 2, the reverse biased voltage of the reverse biased voltage supply line RSTL is always constant at the same level as low level $V_{RST}L$ of the reset signal. Accordingly, the second photodiode DM is always in the reverse biased state.

Due to the first photodiode DS entering the forward biased state, a voltage at high level $V_{RST}H$ is applied to the storage capacitor C2 via the storage node N2. As a result, in the reset period, the storage capacitor C2 is charged and enters a pre-charged state, and as shown in (a) of FIG. 2, the potential of the storage node N2 reaches $V_{RST}H$. Since the potential $V_{RST}H$ is set so as to be lower than the threshold voltage of the MOS transistor M1, the MOS transistor M1 is in the off state in the reset period and the subsequent storage period.

As shown in (b) of FIG. 2, when the reset signal returns to low level $V_{RST}L$, the first photodiode DS changes to the reverse biased state, and the storage period starts. Instantly at this time, as shown in (a) of FIG. 2, a voltage drop equal to the voltage $V_{FD}2$ occurs due to feedthrough via the parasitic capacitance of the first photodiode DS, and the potential of the storage node N2 reaches $V_{N2}0$.

In the storage period, current flows from the storage node N2 to the reset control line RST and the reverse biased voltage supply line RSTL via the first and second photodiodes DS and DM due to charge generated in the first and second photodiodes DS and DM in accordance with the amount of light received. As a result, as shown in (a) of FIG. 2, the potential of the storage node N2 gradually decreases from $V_{N2}0$, and reaches $V_{N2}1$ at the end of the storage period. This potential $V_{N2}1$ of the storage node N2 at this time is also set so as to not exceed the threshold voltage of the MOS transistor M1.

When the readout period starts, as shown in (d) of FIG. 2, the voltage of the readout signal reaches high level $V_{RS}H$, and VDD is supplied to the source of the MOS transistor M1. Due to the readout signal reaching high level $V_{RS}H$ in this way, charge is implanted to the storage node N2 via the storage capacitor C2, and as shown in (a) of FIG. 2, the potential of the storage node N2 rises to $V_{G2}$. The value of high level $V_{RS}H$ of the readout signal is set such that the potential $V_{G2}$ exceeds the threshold voltage of the MOS transistor M1, therefore the MOS transistor M1 is turned on, and an output signal that is in accordance with the potential $V_{G2}$ of the storage node N2 is read out via the signal readout line SL. Here, the value of high level $V_{RS}H$ of the readout signal is set such that the MOS transistor M1 operates in the linear region.

When the readout period ends, as shown in (d) of FIG. 2, the readout signal returns to low level $V_{RS}L$, and the source of the MOS transistor M1 is cut off from VDD. Accordingly, the charge in the storage node N2 moves via the storage capacitor C2, and the potential of the storage node N2 returns to the value $V_{N2}1$, which is lower than the threshold voltage of the MOS transistor M1.

Figure 12:
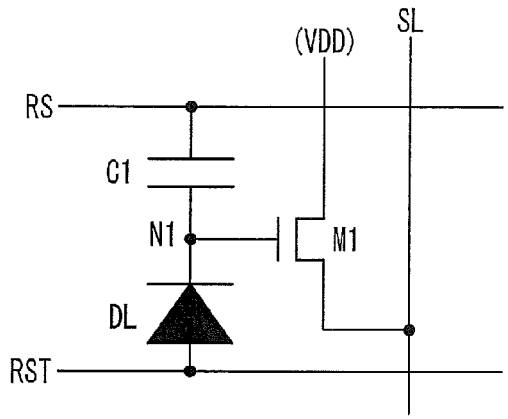
FIG. 12 is a circuit diagram showing a configuration of a conventional example of a photosensor.
Figure 13:
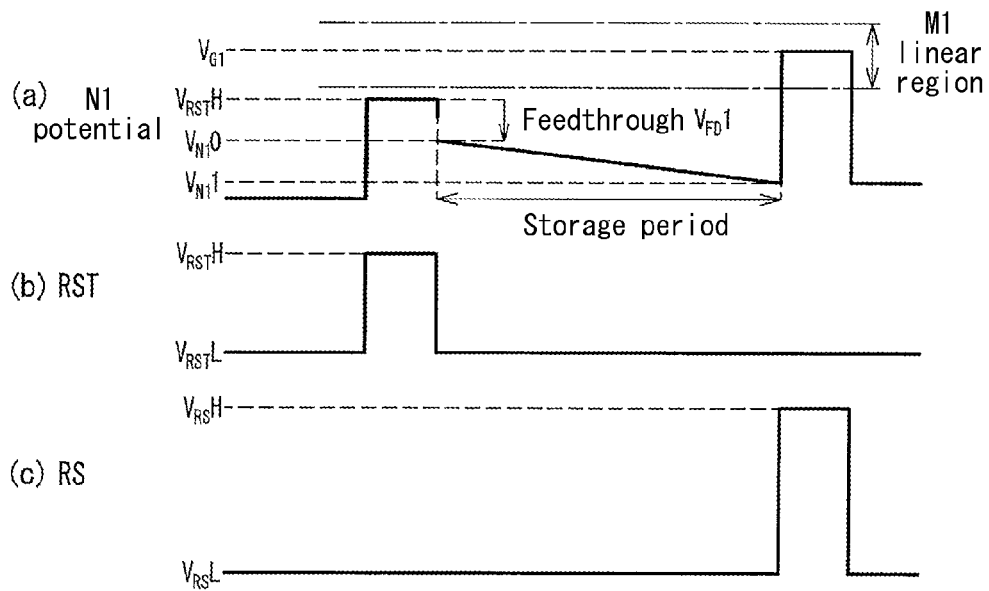
FIG. 13 is a waveform diagram for illustrating operations of the conventional example of a photosensor.

In the above operations, the voltage drop $V_{FD}2$ of the storage node N2 due to feedthrough caused by the parasitic capacitance of the first photodiode DS is lower than the voltage drop $V_{FD}1$ of the storage node N1 in the case of the conventional example shown in FIGS. 12 and 13. The reason for this is as follows.

Specifically, assuming that the total of the amounts of charge generated in the first and second photodiodes DS and DM in the storage period is equivalent to the amount of charge generated in the photodiode DL of the conventional example, the size of the first photodiode DS is smaller than that of the photodiode DL of the conventional example. In this case, the amount of charge that moves due to feedthrough caused by the parasitic capacitance of the first photodiode DS is smaller than that in the case of the photodiode DL of the conventional example. Accordingly, the drop in the potential of the storage node N2 is also smaller.

According to this, the potential $V_{N2}1$ of the storage node N2 at the end of the storage period is higher than the potential $V_{N2}1$ of the storage node N1 in the case of the conventional example. For this reason, even if the capacitance of the storage capacitor C2 is reduced compared to the capacitance of the storage capacitor C1 of the conventional example, the potential of the storage node N2 can be raised to the linear operation region of the MOS transistor M1 by being thrust upward by high level $V_{RS}H$ of the readout signal that is equivalent to that in the conventional example.

In this way, it is possible to reduce the capacitance of the storage capacitor C2 and improve the sensor sensitivity while realizing operations similar to those in the conventional example. Reducing the capacitance of the storage capacitor C2 in this way enables reducing the area of the storage capacitor C2. Accordingly, in the case where a display and sensors are formed integrally, it is possible to raise the aperture ratio of the display portion and improve the display luminance.

Alternatively, in the case of maintaining the capacitance of the storage capacitor C2, it is possible to maintain a sensitivity similar to that of the conventional example even if the amplitude of high level $V_{RS}H$ of the readout signal is reduced. This reduces the amount of power consumed in order to generate the readout signal.

Second Embodiment

The following describes the configuration and operations of a liquid crystal display device including photosensors according to a second embodiment, with reference to FIGS. 3 to 6.

Figure 3:
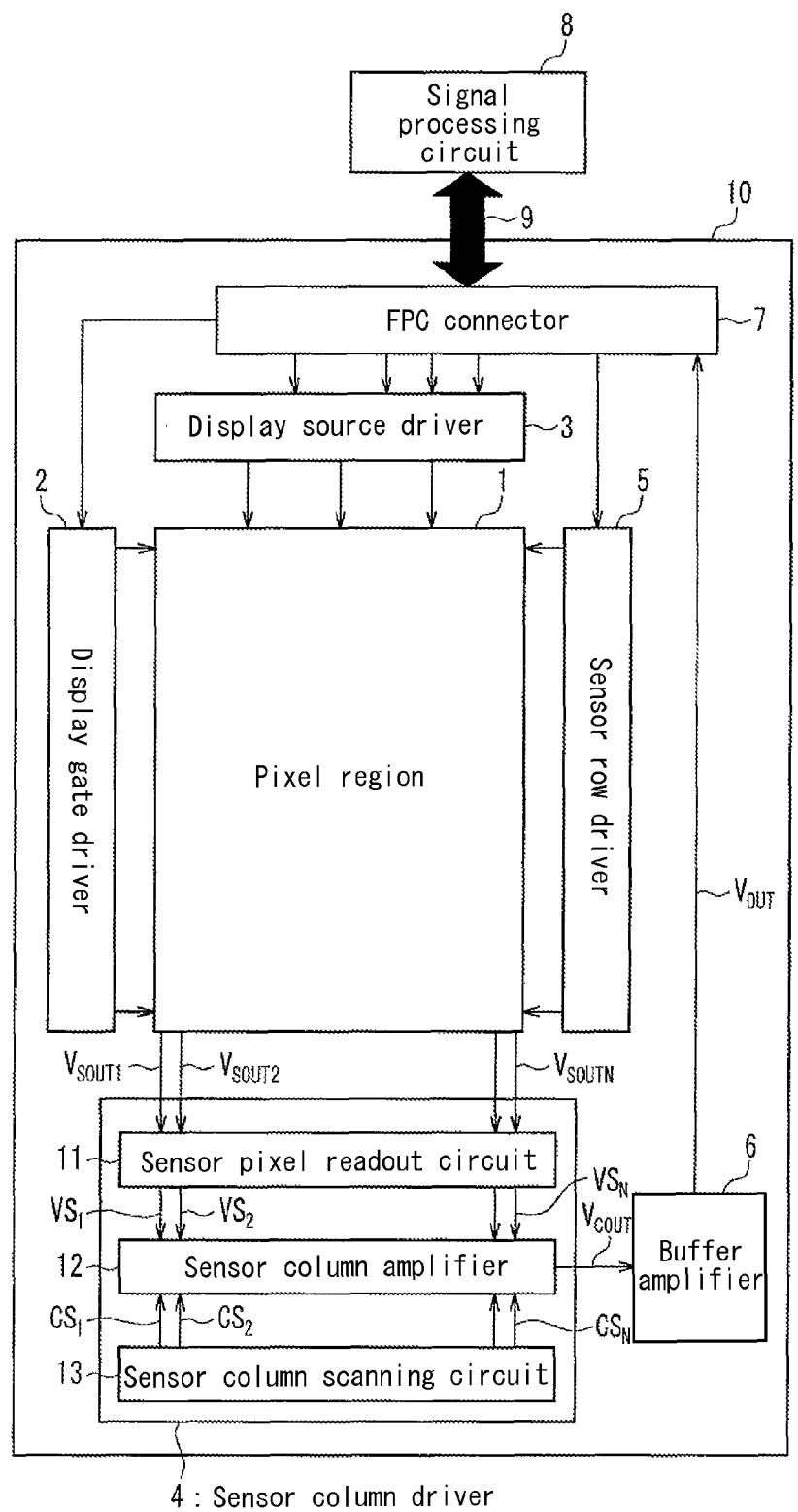
FIG. 3 is a block diagram showing a schematic configuration of a display device according to a second embodiment.

FIG. 3 is a block diagram showing the schematic configuration of an active matrix substrate 10 for a display panel included in the liquid crystal display device of the present embodiment. The active matrix substrate 10 includes a pixel region 1, a display gate driver 2, a display source driver 3, a sensor column driver 4, a sensor row driver 5, a buffer amplifier 6, and an FPC connector 7 that are formed on a glass substrate. Also, a signal processing circuit 8 for processing image signals picked up by photosensors (described later) in the pixel region 1 is connected to the active matrix substrate 10 via the FPC connector 7 and an FPC 9. The display gate driver 2, the display driver 3, the sensor column driver 4, and the sensor row driver 5 correspond to a driving circuit for driving the elements (e.g., transistors) configuring the pixel region 1.

Note that the above constituent elements of the active matrix substrate 10 can also be formed monolithically on the glass substrate by a semiconductor process. Alternatively, a configuration is possible in which the amplifier and various drivers among the above constituent members are mounted on the glass substrate by COG (Chip On Glass) technology or the like. As another alternative, it is conceivable for at least a portion of the above constituent members of the active matrix substrate 10 shown in FIG. 3 to be mounted on the FPC 9. The active matrix substrate 10 is disposed opposing a counter substrate (not shown) that has a counter electrode formed on the entire face thereof, such that a gap is formed between the active matrix substrate 10 and the counter substrate. A liquid crystal material is enclosed in the gap.

The pixel region 1 is a region in which multiple pixels are formed in order to display an image. In the present embodiment, a photosensor (not shown) for picking up an image is provided in each pixel in the pixel region 1.

The sensor column driver 4 includes a sensor pixel readout circuit 11, a sensor column amplifier 12, and a sensor column scanning circuit 13. Sensor output $V_{SOUTj}$ (j=1 to N) from the pixel region 1 is output to the sensor pixel readout circuit 11. Note that since the sensor column driver 4 is normally mounted in the display source driver 3, the sensor output $V_{SOUTj}$ is processed as a signal in the display source driver 3.

The sensor pixel readout circuit 11 outputs peak hold voltages VS, of the sensor output $V_{SOUTj}$ to the sensor column amplifier 12. The sensor column amplifier 12 includes N column amplifiers that respectively correspond to the photosensors in the N columns in the pixel region 1, and the column amplifiers respectively amplify the peak hold voltages $VS_j$, and output the resulting peak hold voltages to the buffer amplifier 6 as $V_{COUT}$.

The sensor column scanning circuit 13 outputs column select signals $CS_j$ to the sensor column amplifier 12 in order to successively connect the column amplifiers of the sensor column amplifier 12 to the output bound for the buffer amplifier 6.

The buffer amplifier 6 then further amplifies the $V_{COUT}$ that has been output from the sensor column amplifier 12, and outputs the resulting amplified $V_{COUT}$ to the signal processing circuit 8 as panel output (a photosensor signal) $V_{OUT}$.

According to the above configuration, the display device of the present embodiment obtains panel output $V_{OUT}$ that is in accordance with the amount of light received by the photosensors provided aligned in the pixel region 1. The panel output $V_{OUT}$ is sent to the signal processing circuit 8, subjected to A/D conversion, and then stored in a memory (not shown) as panel output data. Specifically, the same number of panel output data pieces as the number of pixels (number of photosensors) in the pixel region 1 are stored in this memory. With use of the panel output data stored in the memory, the signal processing circuit 8 performs various types of signal processing such as image pickup and the detection of a touch area.

Figure 4:
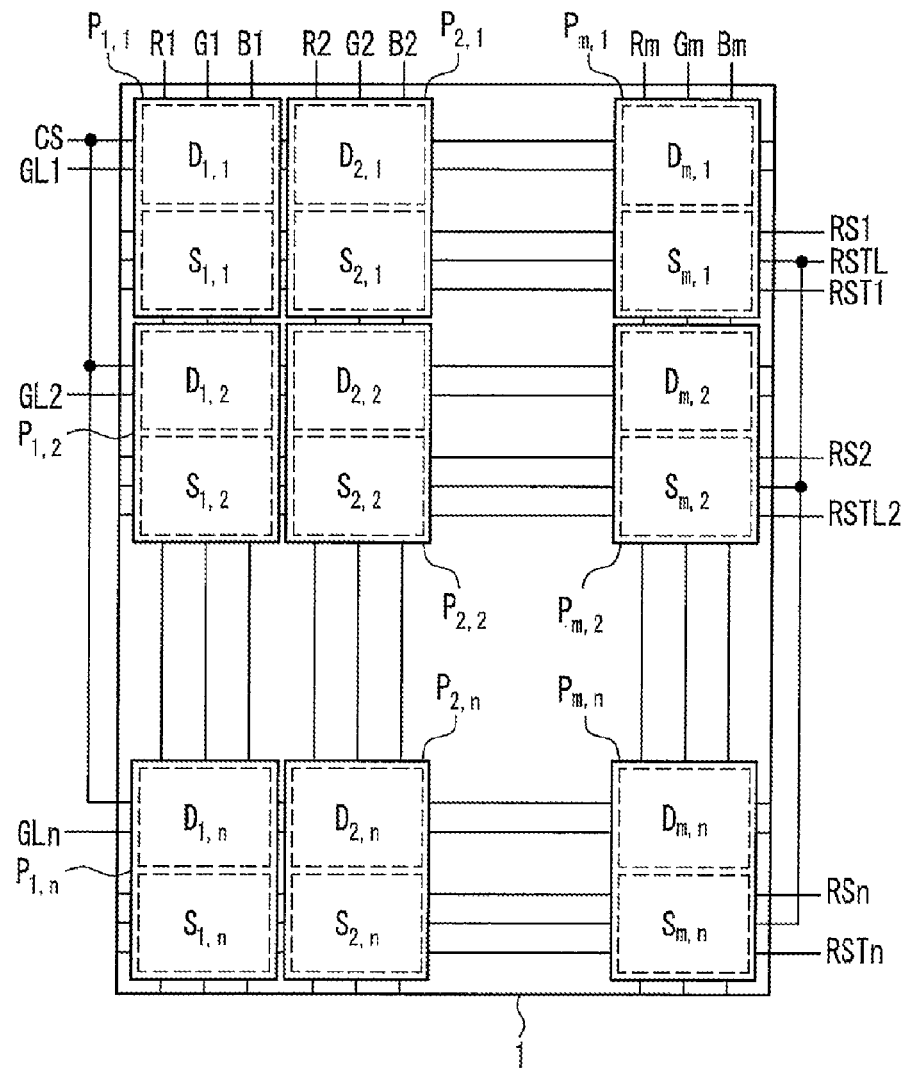
FIG. 4 is a plan view a schematic configuration of a pixel region of the display device according to the second embodiment.

FIG. 4 is a plan view showing the schematic configuration of the pixel region 1 in the display device shown in FIG. 3, and FIG. 4 shows the arrangement of the pixels and the photosensors. The pixel region 1 includes m×n pixel blocks $P_{i,k}$ (i=1 to m, k=1 to n). The pixel region 1 is also provided with m×n display portions $D_{i,k}$ and m×n photosensor portions $S_{i,k}$. Accordingly, each pixel block $P_{i,k}$ has one display portion $D_{i,k}$ and one photosensor portion $S_{i,k}$.

In the pixel region 1, the pixel blocks $P_{i,k}$ are provided with wiring in a matrix configuration. In the column direction, scanning lines GLk (k=1 to n) and a CS voltage line CS are connected to the display portions $D_{i,k}$. Also, readout control lines RSk, reset control lines RSTk, and a reverse biased voltage supply line RSTL are connected to the photosensor portions $S_{i,k}$. In the row direction, three data lines for the three primary colors, that is to say, red (R) data lines Ri (i=1 to m), green (G) data lines Gi, and blue (B) data lines Bi, are connected to the pixel blocks $P_{i,k}$ in the respective rows.

The scanning lines GLk and the CS voltage line CS are connected to the display gate driver 2. The data lines Ri, Gi, and Bi are connected to the display source driver 3. The readout control lines RSk, the reset control lines RSTk, and the reverse biased voltage supply line RSTL are connected to the sensor row driver 5. The sensor row driver 5 successively selects a set of a readout control line RSk and a reset control line RSTk at a predetermined time interval. Accordingly, the photosensor rows in the pixel region 1 from which a signal charge is to be read out are successively selected.

Figure 5:
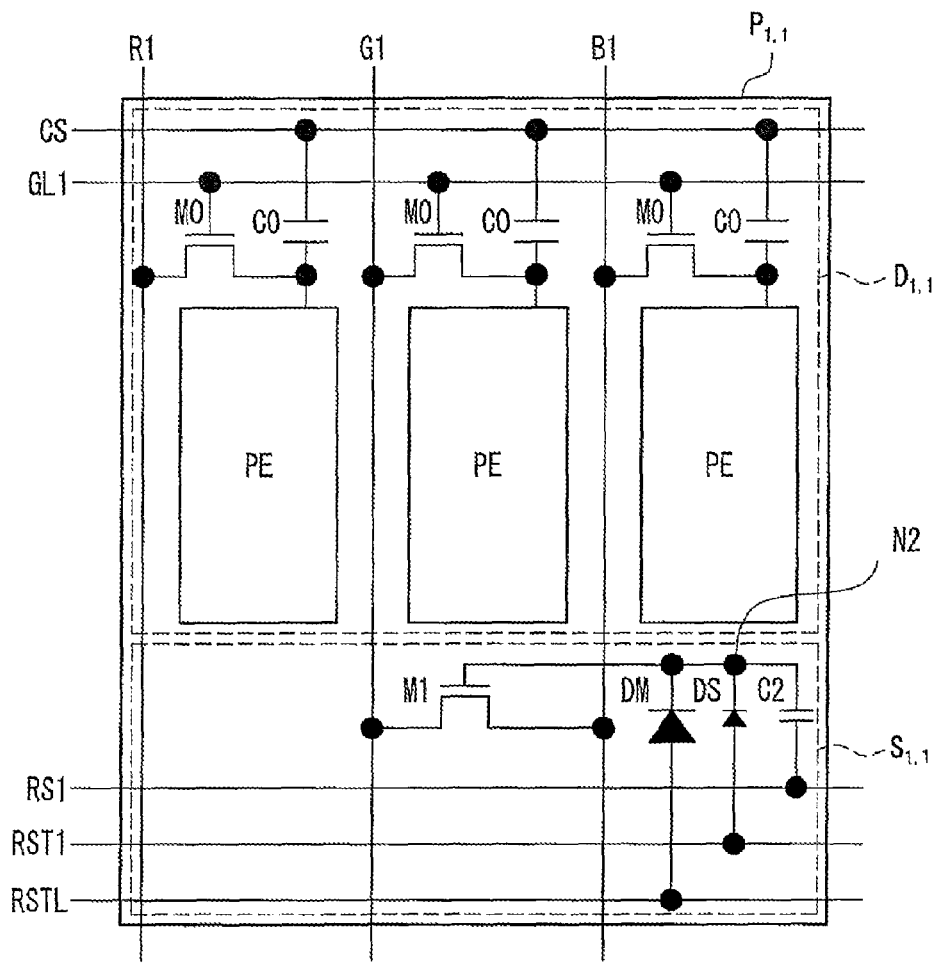
FIG. 5 is a circuit diagram showing a specific configuration of a pixel of the display device according to the second embodiment.

FIG. 5 shows the specific configuration of the pixel block $P_{1,1}$, which is a unit pixel of the pixel region 1 in FIG. 4. In the display portion $D_{1,1}$, a thin-film MOS transistor M0, which is a pixel switching element, is provided at each intersection between the scanning line GL1 and the data lines R1, G1, and B1. The gate electrodes of the MOS transistors M0 are connected to the scanning line GL1, the source electrodes are respectively connected to the data lines R1, G1, and B1, and the drain electrodes are respectively connected to pixel electrodes PE for displaying R (red), G (green), and B (blue). A display portion CS capacitor C0 is formed between the drain electrode of each MOS transistor M0 and the electrodes connected to the CS voltage line CS. In the display portion $D_{1,1}$, the constituent elements corresponding to the various colors (e.g., the MOS transistors M0, the CS capacitors C0, and the pixel electrodes PE) configure the various colors of display elements.

The configuration of the photosensor portion $S_{1,1}$ is similar to the configuration of the photosensor of the first embodiment that is shown in FIG. 1. Specifically, the photosensor portion $S_{1,1}$ includes the first photodiode DS, the second photodiode DM, the storage capacitor C2, and the MOS transistor M1. The second terminal of the storage capacitor C2 is connected to the readout control line RS1. The anode of the first photodiode DS is connected to the reset control line RST1. The anode of the second photodiode DM is connected to the reverse biased voltage supply line RSTL.

The source of the MOS transistor M1 is connected to the data line G1, and the drain is connected to the data line B1. Accordingly, the data line G1 also serves as wiring for the supply of the constant voltage VDD from the sensor column driver 4 to the MOS transistor M1. Also, the data line B1 also serves as the signal readout line SL in FIG. 1.

Note that although not shown, similarly to the configuration of a well-known MOS image sensor, the drain of a MOS transistor M2 is connected to the end of the data line B1. Also, output wiring is connected to the drain of the MOS transistor M2, and the potential of the drain is output as the output signal $V_{SOUT}$ from the photosensor $S_{1,1}$ to the sensor column driver 4. The source of the MOS transistor M2 is connected to VSS, and the gate is connected to a reference voltage power supply. The MOS transistor M2 functions as a source follower amplifier along with the transistor M1 in the photosensor portion $S_{1,1}$. Similarly to the sensor column driver 4, the MOS transistor M2 is normally mounted in the display source driver 3 shown in FIG. 3, and the MOS transistor M2 and the sensor column driver 4 are connected by wiring in the display source driver 3.

<Photosensor Portion Operations>

Figure 6:
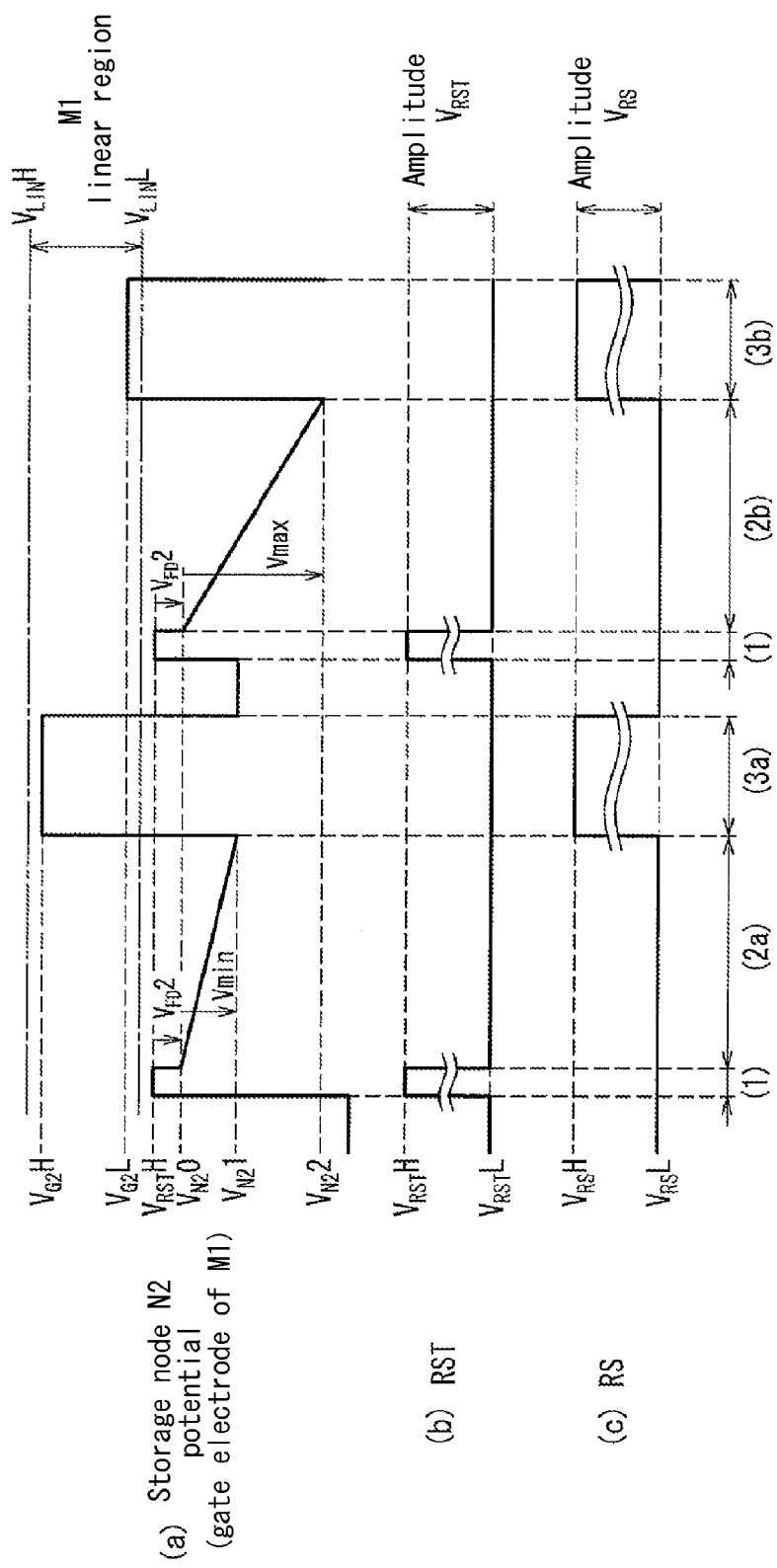
FIG. 6 is a waveform diagram showing operations of a photosensor portion of the display device according to the second embodiment.

Operations of the display portion $D_{1,1}$ will not be described since they are similar to the operations of a normal liquid crystal pixel. Operations of the photosensor portion $S_{1,1}$ are basically the same as the operations of the photosensor of the first embodiment that was described with reference to FIGS. 1 and 2. The following description partially supplements the description of operations with reference to FIG. 6. In FIG. 6, (a) shows a waveform of change in the potential of the storage node N2, (b) shows a waveform of the signal voltage of the reset control line RST, and (c) shows a waveform of the signal voltage of the readout control line RS. Note that in FIG. 6, the signals of the reset control line RST1 and the readout control line RS1 are shown as RST and RS. Also, in the following description, the descriptions in the sections (1), (2a), (2b), (3a), and (3b) respectively correspond to the periods (1), (2a), (2b), (3a), and (3b) shown in FIG. 6.

The capacitance $C_{N2}$ of the storage node N2 is represented by the following expression. $C_{DS}$ and $C_{DM}$ are the parasitic capacitances of the first and second photodiodes DS and DM respectively.

$$C_{N2} = C_{DS} + C_{DM} + C_{M1} + C_2$$

(1) When high level $V_{RST}H$ is supplied from the reset control line RST, the potential of the storage node N2 is reset to $V_{RST}H$. Immediately thereafter, the potential of the storage node N2 reaches $V_{N2}0$ shown in the following expression as a result of the voltage drop $V_{FD}$ due to feedthrough. Note that voltage $V_{RST} = (V_{RST}H - V_{RST}L)$.

$$V_{N2}0 = V_{RST}H - V_{FD}2$$
$$= V_{RST}H - C_{DS}/C_{N2} \times V_{RST}$$

(2a) In the storage period, when the charge generated in the first and second photodiodes DS and DM in accordance with the amount of light received is the minimum value Qmin, the potential of the storage node N2 drops by Vmin to $V_{N2}1$.

$$V_{N2}1 = V_{N2}0 - V\min$$
$$= V_{N2}0 - Q\min/C_{N2}$$

(3a) Due to high level $V_{RS}H$ of the readout signal being applied to the storage node N2 via the storage capacitance C2, the gate voltage of the MOS transistor M1 is thrust upward to the range in which the MOS transistor M1 can operate in the linear region. The gate voltage $V_{G2}H$ at this time is represented by the following expression. Note that voltage $V_{RS} = (V_{RS}H - V_{RS}L)$.

$$V_{G2}H = V_{N2}1 + C_2/C_{N2} \times V_{RS}$$
$$= V_{RST}H - C_{DS}/C_{N2} \times V_{RST} - Q\min/C_{N2} + C_2/C_{N2} \times V_{RS}$$

(2b) On the other hand, in the storage period, when the charge generated in the first and second photodiodes DS and DM in accordance with the amount of light received is the maximum value Qmax, the potential of the storage node N2 drops by Vmax to $V_{N2}2$.

$$V_{N2}2 = V_{N2}0 - V\max$$
$$= V_{N2}0 - Q\max/C_{N2}$$

(3b) Due to high level $V_{RS}H$ of the readout signal being applied to the storage node N2 via the storage capacitance C2, the gate voltage of the MOS transistor M1 is thrust upward to the range in which the MOS transistor M1 can operate in the linear region. The gate voltage $V_{G2}L$ at this time is represented by the following expression.

$$V_{G2}L = V_{N2}2 + C_2/C_{N2} \times V_{RS}$$
$$= V_{RST}H - C_{DS}/C_{N2} \times V_{RST} - Q\max/C_{N2} + C_2/C_{N2} \times V_{RS}$$

<Sensor Sensitivity>

Sensor sensitivity S is represented by the following formula for computation. Specifically, during sensor data readout (the periods in (3a) and (3b)), the sensor sensitivity S is equal to the gate voltage range ($V_{G2}H - V_{G2}L$) of the MOS transistor M1.

$$S = V_{G2}H - V_{G2}L$$
$$= (Q\max - Q\min)/C_{N2}$$
$$= (Q\max - Q\min)/(C_{DS} + C_{DM} + C_{M1} + C_2)$$

Note that $V_{G2}H$ and $V_{G2}L$ need to satisfy the following conditional expressions in order for the MOS transistor M1 to operate in the linear region. For this reason, the storage capacitor C2 has an upper limit value and a lower limit value as will be described below. $V_{LIN}H$ is the upper limit value of the gate voltage in order for the MOS transistor M1 to operate in the linear region, and $V_{LIN}L$ is the lower limit value of the gate voltage in order for the MOS transistor M1 to operate in the linear region.

$$V_{G2}H \leq V_{LIN}H \text{ and } V_{G2}L \geq V_{LIN}L$$

Accordingly, the expression for the upper limit value of the storage capacitance C2 is as follows. Specifically, based on $V_{G2}H \leq V_{LIN}H$, $$V_{RST}H - C_{DS}/C_{N2} \times V_{RST} - Q\min/C_{N2} + C_2/C_{N2} \times V_{RS} \leq V_{LIN}H$$

When this is transformed, $$(C_{DS}+C_{DM}+C_{M1}+C_2)V_{RST}H - C_{DS}V_{RST} - Q\min + C_2 \times V_{RS} \leq (C_{DS}+C_{DM}+C_{M1}+C_2)V_{LIN}H$$

Accordingly, the upper limit value of the storage capacitance C2 is as follows.

$$C_2 \leq \{Q\min + C_{DS}V_{RST} + (C_{DS}+C_{DM}+C_{M1})(V_{LIN}H - V_{RST}H)\}/(V_{RST}H + V_{RS} - V_{LIN}H)$$

Also, the expression for the lower limit value of the storage capacitance C2 is as follows. Specifically, based on $V_{G2}L \geq V_{LIN}L$, $$V_{RST}H - C_{DS}/C_{N2} \times V_{RST} - Q\max/C_{N2} + C_2/C_{N2} \times V_{RS} \geq V_{LIN}L$$

When this is transformed, $$(C_{DS}+C_{DM}+C_{M1}+C_2)V_{RST}H - C_{DS}V_{RST} - Q\max + C_2 \times V_{RS} \geq (C_{DS}+C_{DM}+C_{M1}+C_2)V_{LIN}L$$

Accordingly, the lower limit value of the storage capacitance C2 is as follows.

$$C_2 \geq \{Q\max + C_{DS}V_{RST} + (C_{DS}+C_{DM}+C_{M1})(V_{LIN}L - V_{RST}H)\}/(V_{RST}H + V_{RS} - V_{LIN}L)$$

According to the above, the sensor sensitivity S is represented by the storage capacitance C2 limiting expressions for causing the MOS transistor M1 to operate in the linear region, as well as the following expression.

$$S = (Q\max - Q\min)/(C_{DS} + C_{DM} + C_{M1} + C_2)$$

Note that, $$\{Q\max + C_{DS}V_{RST} + (C_{DS}+C_{DM}+C_{M1})(V_{LIN}L - V_{RST}H)\}/(V_{RST}H + V_{RS} - V_{LIN}L) \leq C_2 \leq \{Q\min + C_{DS}V_{RST} + (C_{DS}+C_{DM}+C_{M1})(V_{LIN}H - V_{RST}H)\}/(V_{RST}H + V_{RS} - V_{LIN}H)$$

<Sensor Sensitivity Improvement Rate>

Letting S1 be the sensitivity in the configuration of the conventional example shown in FIG. 12, and S2 be the sensitivity in the configuration in FIG. 1, and given $C_{DL} = (C_{DS} + C_{DM})$ and $C_2 = \alpha C_1$ ($0 < \alpha < 1$), the sensor sensitivity improvement rate S2/S1 of the configuration of the present embodiment is as follows.

$$S2/S1 = (C_{DL} + C_{M1} + C_1)/(C_{DS} + C_{DM} + C_{M1} + \alpha C_1)$$
$$= 1 + (1-\alpha)C_1/(C_{DS} + C_{DM} + C_{M1} + \alpha C_1)$$

It can be understood from this expression that the sensor sensitivity improves as α is reduced. However, since the storage capacitance C2 is limited as described above in order for the MOS transistor M1 to operate in the linear region, this limits the improvement in the sensor sensitivity.

Note that in the present embodiment, one photosensor portion is disposed for each pixel in the pixel region 1, that is to say, one photosensor portion is disposed for each display portion having the three R (red), G (green), and B (blue) pixel electrodes PE. However, the configuration of the pixel region 1 is not limited to this, and the proportion of photosensors to display portions can be set arbitrarily. Also, the number of and arrangement of the various elements in the photosensor portion can take various forms.

Third Embodiment

Figure 7A:
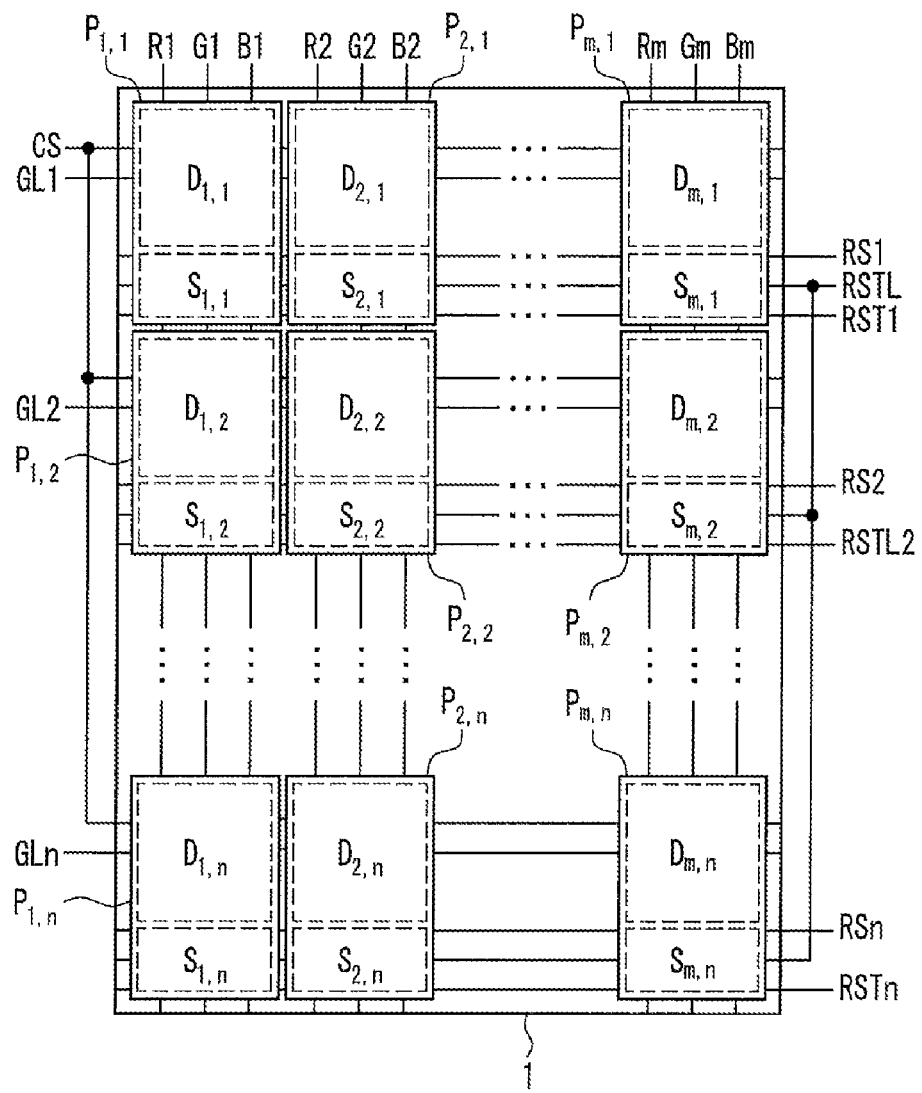
FIG. 7A is a schematic configuration diagram showing a configuration of a pixel region of a display device according to a third embodiment.
Figure 7B:
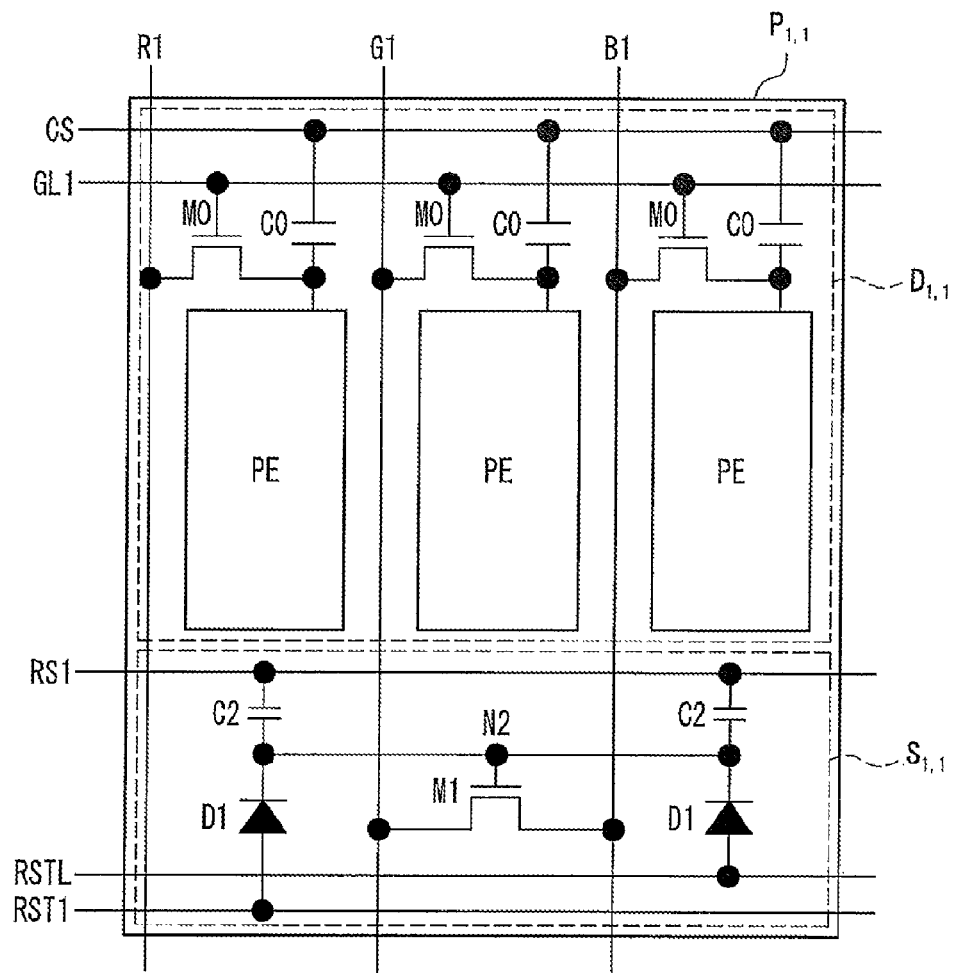
FIG. 7B is a circuit diagram showing a configuration of a pixel of the display device according to the third embodiment.
Figure 7C:
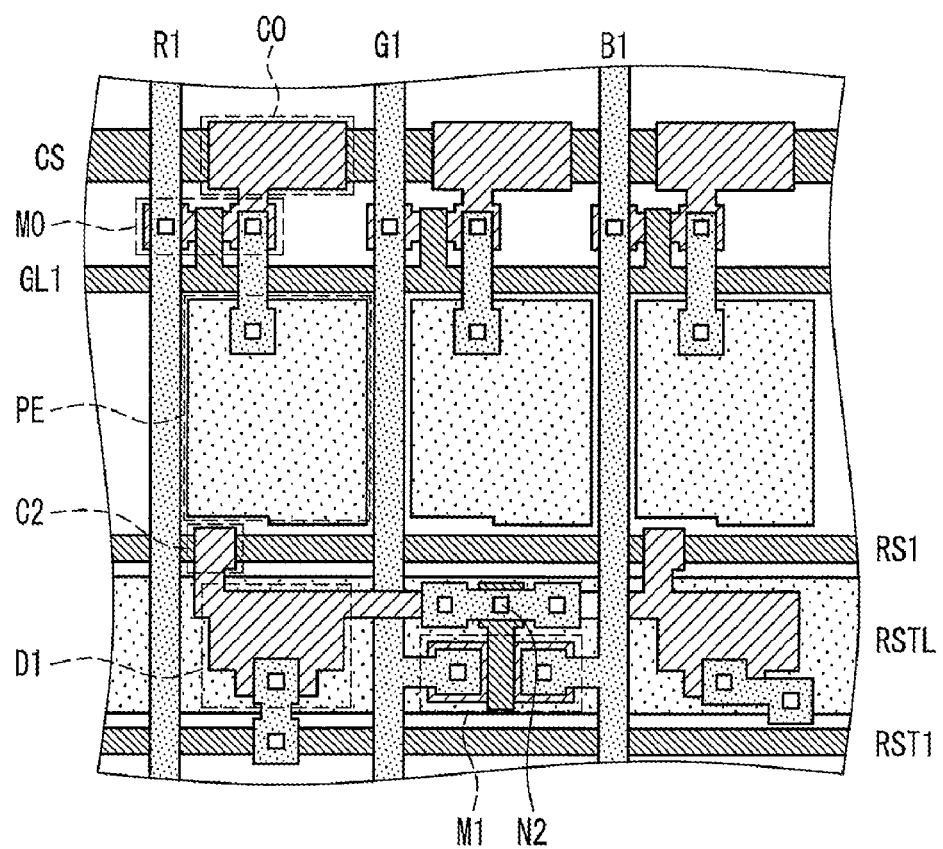
FIG. 7C is a plan view showing a layout of elements in the pixel of the display device according to the third embodiment.

The following describes a liquid crystal display device including photosensors according to a third embodiment, with reference to FIGS. 7A to 7C. In the present embodiment, the photosensor portions provided in the pixel region of the liquid crystal display device have a different form than those of the second embodiment. Note that the overall configuration of the liquid crystal display device of the present embodiment is similar to that of the liquid crystal display device of the second embodiment shown in FIG. 3. Also, the basic overall configuration of the pixel region 1 and the configuration of the display portion are similar to those of the second embodiment. Accordingly, the same reference signs have been given to elements that are similar to those in the second embodiment, and redundant descriptions will not be given. The same follows for the fourth to seventh embodiments described later.

FIG. 7A is a plan view showing the schematic configuration of the pixel region 1, and shows the arrangement relationship between the display portions $D_{i,k}$ and the photosensor portions $S_{i,k}$ in the pixel blocks $P_{i,k}$ (i=1 to m, k=1 to n). Similarly to the second embodiment, each pixel block $P_{i,k}$ has one display portion $D_{i,k}$ and one photosensor portion $S_{i,k}$. Various types of wiring, namely the scanning lines GLk, the CS voltage line CS, the data lines Ri, Gi, and Bi, the readout control lines RSk, the reset control lines RSTk, and the reverse biased voltage supply line RSTL, are provided in the pixel region 1 in a manner similar to that in the second embodiment.

FIG. 7B shows the specific configuration of the pixel block $P_{1,1}$, which is a unit pixel of the pixel region 1 in FIG. 7A. The configuration of the display portion $D_{1,1}$ is similar to that in the second embodiment, and the configuration of the photosensor portion $S_{1,1}$ is different from that in the second embodiment. The photosensor portion includes two photodiodes D1 having the same performance, two storage capacitors C2 having the same capacitance, and one MOS transistor M1.

The cathodes of the two photodiodes D1 are both connected to the storage node N2. Furthermore, the first terminals of the two storage capacitors C2 and the gate of the MOS transistor M1 are connected to the storage node N2. The anode of one photodiode D1 (on the left side) is connected to the reset control line RST1. The anode of the other photodiode D1 (on the right side) is connected to the reverse biased voltage supply line RSTL. The second terminals of the two storage capacitors C2 are both connected to the readout control line RS1.

The source of the MOS transistor M1 is connected to the data line G1, and the drain is connected to the data line B1. Accordingly, the data line G1 also serves as wiring for the supply of the constant voltage VDD from the sensor column driver 4 to the MOS transistor M1. The data line B1 also serves as the signal readout line SL in FIG. 1.

FIG. 7C shows the layout of the various elements in the case where the pixel block $P_{1,1}$ shown in FIG. 7B is formed on a glass substrate by a semiconductor process. The reference signs of the elements correspond to the elements in the circuit diagram of FIG. 7B.

<Photosensor Portion Operations>

The operations of the photosensor portion $S_{1,1}$ according to this configuration are basically the same as the operations of the photosensor portion $S_{1,1}$ in the second embodiment described with reference to FIG. 6. Note that in the present embodiment, as previously described, the first and second photodiodes DS and DM are replaced with the two photodiodes D1, and two storage capacitors C2 are used. For this reason, the expressions representing the capacitance $C_{N2}$ of the storage node N2, the potential $V_{N2}0$ of the storage node N2, and the like are different from those of the second embodiment, as described below.

Specifically, the capacitance $C_{N2}$ of the storage node N2 is represented by the following expression.

$$C_{N2} = 2C_{D1} + C_{M1} + 2C_2$$

(1) The potential $V_{N2}0$ of the storage node N2 is represented by the following expression as a result of the voltage drop $V_{FD}$ due to feedthrough.

$$V_{N2}0 = V_{RST}H - C_{D1}/C_{N2} \times V_{RS}T$$

(2) In the storage period, when the charge generated in one of the photodiodes D1 is the minimum value Qmin and when it is the maximum value Qmax, the potentials $V_{N2}1$ and $V_{N2}2$ of the storage node N2 respectively reached at those times are represented by the following expressions.

In the case of the minimum value Qmin, $V_{N2}1 = V_{N2}0 - 2Q\text{min}/C_{N2}$ In the case of the maximum value Qmax, $V_{N2}2 = V_{N2}0 - 2Q\text{max}/C_{N2}$ (3) The potentials $V_{G2}H$ (in the case of Qmin) and $V_{G2}L$ (in the case of Qmax) of the storage node N2 reached due to being thrust upward by the application of high level $V_{RS}H$ of the readout signal are represented by the following expressions.

$$\begin{aligned} V_{G2}H &= V_{N2}1 + 2C_2/C_{N2} \times V_{RS} \\ &= V_{RST}H - C_{D1}/C_{N2} \times V_{RST} - 2Q\text{min}/C_{N2} + \\ &\quad 2C_2/C_{N2} \times V_{RS} \end{aligned}$$

$$\begin{aligned} V_{G2}L &= V_{N2}2 + 2C_2/C_{N2} \times V_{RS} \\ &= V_{RST}H - C_{DS}/C_{N2} \times V_{RST} - 2Q\text{max}/C_{N2} + \\ &\quad 2C_2/C_{N2} \times V_{RS} \end{aligned}$$

The expressions representing the sensor sensitivity and the sensor sensitivity improvement rate are also easily obtained by modifying the expressions in the case of the second embodiment according to the above-described differences in values, but a description of this will not particularly be given.

Fourth Embodiment

Figure 8A:
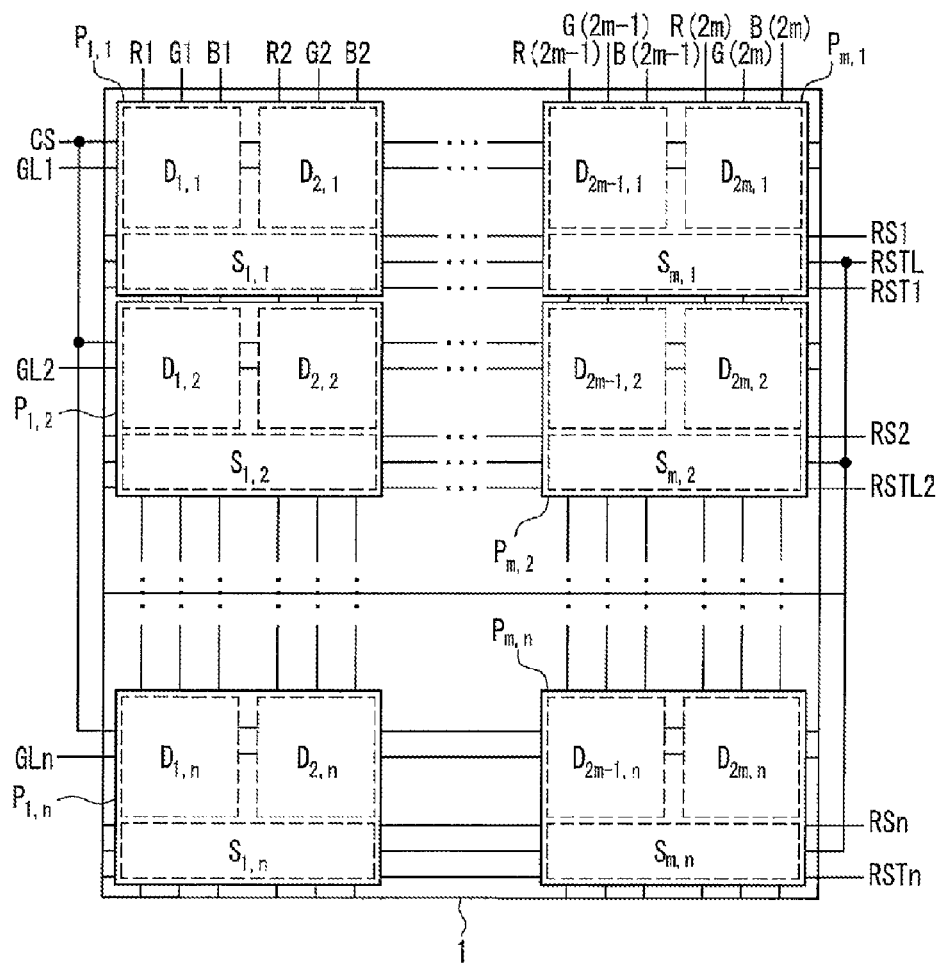
FIG. 8A is a schematic configuration diagram showing a configuration of a pixel region of a display device according to a fourth embodiment.
Figure 8B:
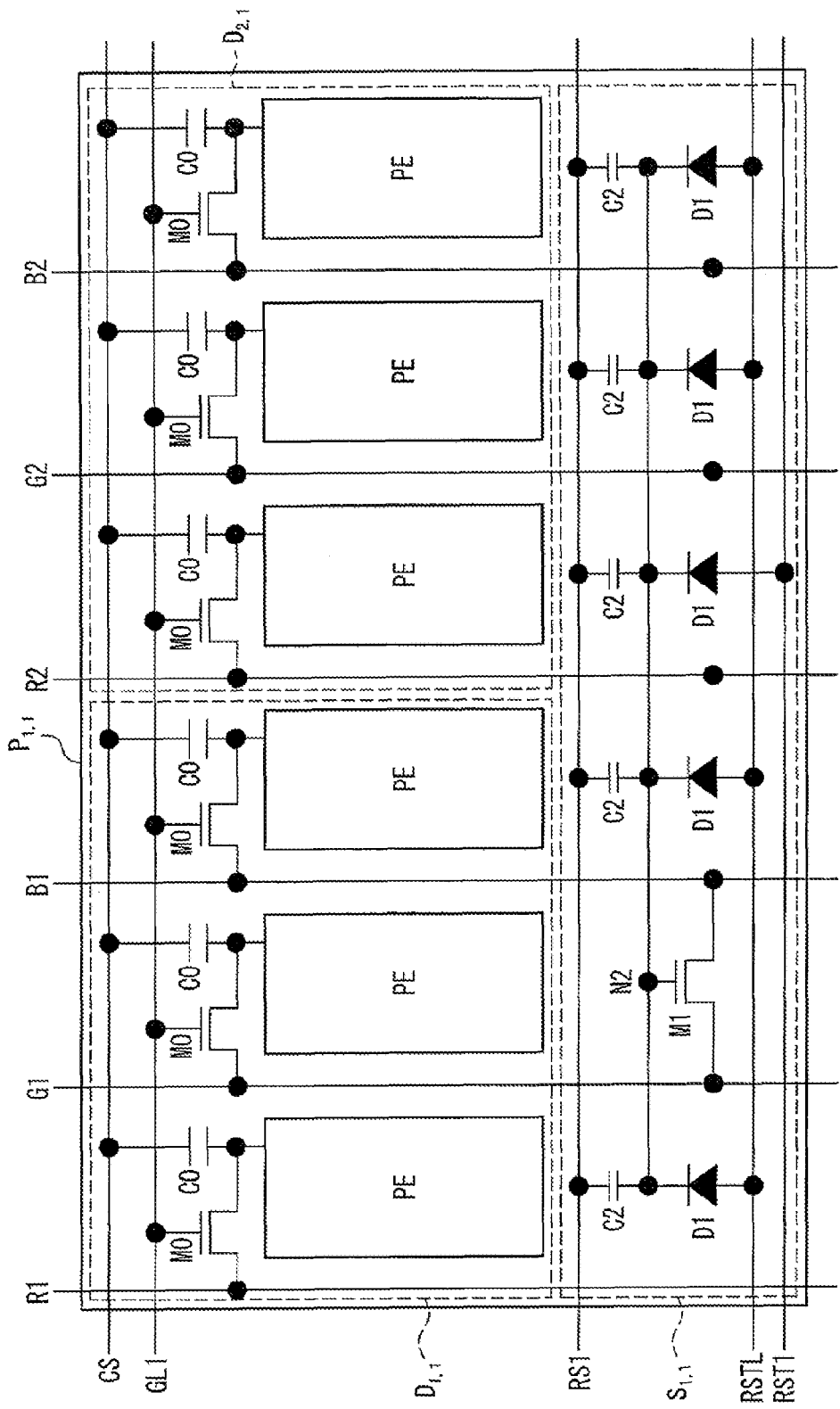
FIG. 8B is a circuit diagram showing a configuration of a pixel of the display device according to the fourth embodiment.
Figure 8C:
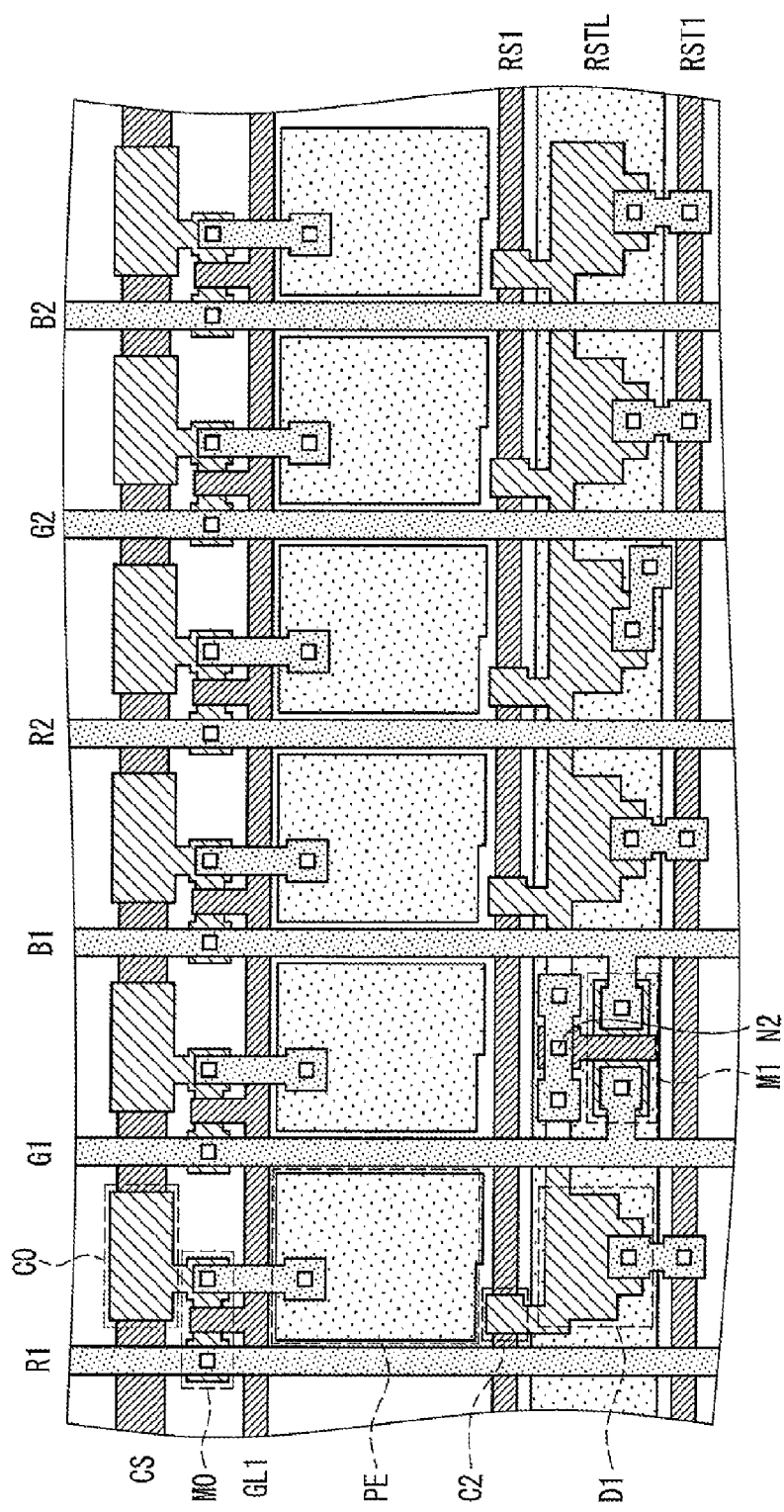
FIG. 8C is a plan view showing a layout of elements in the pixel of the display device according to the fourth embodiment.

The following describes a liquid crystal display device including photosensors according to a fourth embodiment, with reference to FIGS. 8A to 8C.

FIG. 8A is a plan view showing the schematic configuration of the pixel region 1, and shows the arrangement relationship between display portions $D_{2i-1,k}$ and $D_{2i,k}$ and the photosensor portions $S_{i,k}$ in the pixel blocks $P_{i,k}$. In the present embodiment, each pixel block $P_{i,k}$ (i=1 to m, k=1 to n) has two display portions $D_{2i-1,k}$ and $D_{2i,k}$ and one photosensor portion $S_{i,k}$. In other words, in the pixel region 1, 2m display portions are disposed in the horizontal direction, and n display portions are disposed in the vertical direction. Accordingly, the resolution of the liquid crystal display device is 2m×n.

FIG. 8B shows the specific configuration of the pixel block $P_{1,1}$, which is a unit pixel of the pixel region 1 in FIG. 8A. The configuration of the display portions $D_{1,1}$ and $D_{2,1}$ is similar to that in the second embodiment. In the present embodiment, the one photosensor portion $S_{1,1}$ is provided for the two display portions $D_{1,1}$ and $D_{2,1}$. The photosensor portion $S_{1,1}$ includes five photodiodes D1 having the same performance, five storage capacitors C2 having the same capacitance, and one MOS transistor M1.

The cathodes of the five photodiodes D1 are each connected to the storage node N2. Furthermore, the first terminals of the five storage capacitors C2 and the gate of the MOS transistor M1 are connected to the storage node N2. Among the five photodiodes D1, the anode of only one photodiode D1 (the third photodiode D1 from the left end in FIG. 8B) is connected to the reset control line RST1. The anodes of the other four photodiodes D1 are connected to the reverse biased voltage supply line RSTL. The second terminals of the five storage capacitors C2 are each connected to the readout control line RS1.

The source of the MOS transistor M1 is connected to the data line G1 of the display portion $D_{1,1}$, and the drain is connected to the data line B1 of the display portion $D_{1,1}$. Accordingly, the data line G1 also serves as wiring for the supply of the constant voltage VDD from the sensor column driver 4 to the MOS transistor M1. Also, the data line B1 also serves as the signal readout line SL in FIG. 1.

FIG. 8C shows the layout of the various elements in the case where the pixel block $P_{1,1}$ shown in FIG. 8B is formed on a glass substrate by a semiconductor process. The reference signs of the elements correspond to the elements in the circuit diagram of FIG. 8B.

<Photosensor Portion Operations>

The operations of the photosensor portion $S_{1,1}$ having the above-described configuration are basically the same as the operations of the photosensor portion $S_{1,1}$ in the second embodiment described with reference to FIG. 6. Note that in the present embodiment, the five photodiodes D1 and the five storage capacitors C2 are used, and one of the photodiodes D1 is connected to the reset control line RST1. For this reason, the expressions representing the capacitance $C_{N2}$ of the storage node N2, the potential $V_{N2}0$ of the storage node N2, and the like are different from those of the second embodiment, as described below.

Specifically, the capacitance $C_{N2}$ of the storage node N2 is represented by the following expression.

$$C_{N2}=5C_{D1}+C_{M1}+5C_2$$

(1) The potential $V_{N2}0$ of the storage node N2 is represented by the following expression as a result of the voltage drop $V_{FD}$ due to feedthrough.

$$V_{N2}0=V_{RST}H-C_{D1}/C_{N2}\times V_{RST}$$

(2) In the storage period, when the charge generated in the one photodiode D1 is the minimum value Qmin and when it is the maximum value Qmax, the potentials $V_{N2}1$ and $V_{N2}2$ of the storage node N2 are represented by the following expressions.

In the case of the minimum value Qmin, $V_{N2}1=V_{N2}0-5Qmin/C_{N2}$

In the case of the maximum value Qmax, $V_{N2}1=V_{N2}0-5Qmax/C_{N2}$ (3) The potentials $V_{G2}H$ (in the case of Qmin) and $V_{G2}L$ (in the case of Qmax) of the storage node N2 reached due to being thrust upward by the application of high level $V_{RS}H$ of the readout signal are represented by the following expressions.

$$V_{G2}H = V_{N2}1 + 5C_2/C_{N2} \times V_{RS}$$
$$= V_{RST}H - C_{D1}/C_{N2} \times V_{RST} - 5Qmin/C_{N2} +$$
$$5C_2/C_{N2} \times V_{RS}$$

$$V_{G2}L = V_{N2}2 + 5C_2/C_{N2} \times V_{RS}$$
$$= V_{RST}H - C_{DS}/C_{N2} \times V_{RST} - 5Qmax/C_{N2} +$$
$$5C_2/C_{N2} \times V_{RS}$$

Also, the expressions representing the sensor sensitivity and the sensor sensitivity improvement rate are also easily obtained by modifying the expressions in the case of the second embodiment according to the above-described differences in values, but a description of this will not particularly be given.

Fifth Embodiment

Figure 9A:
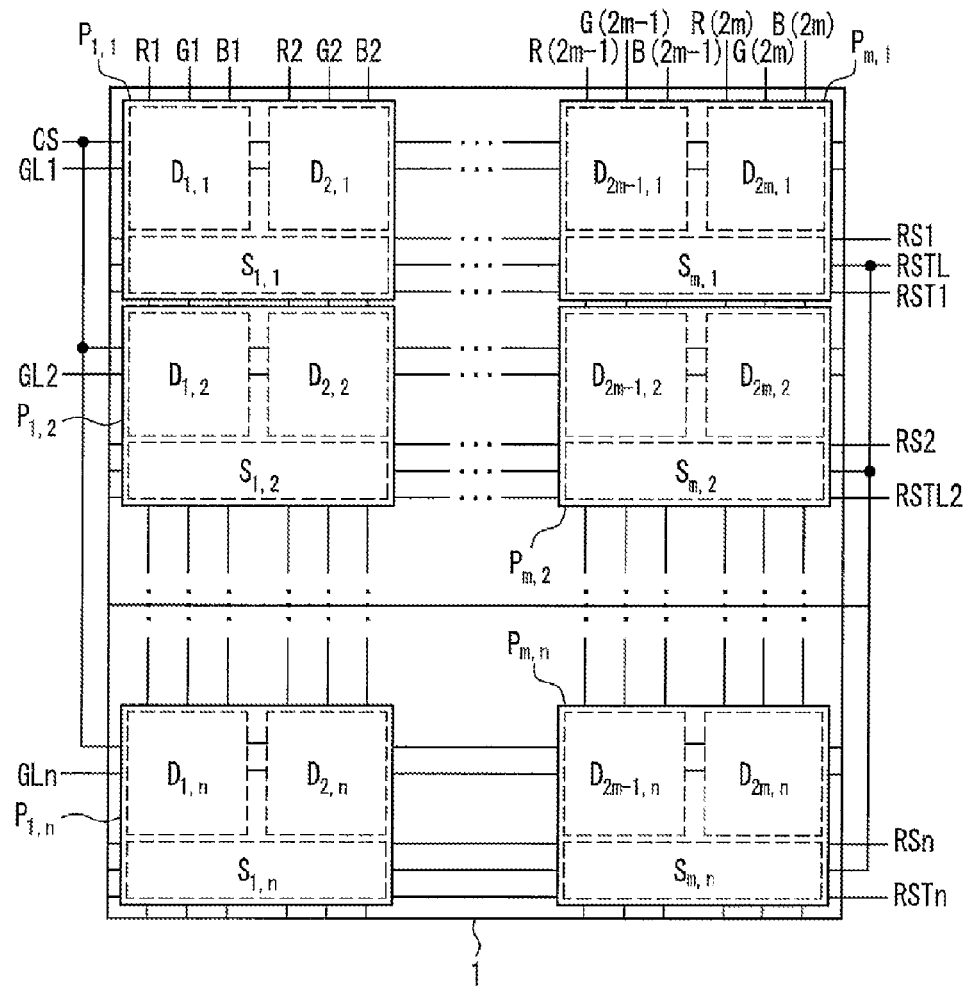
FIG. 9A is a schematic configuration diagram showing a configuration of a pixel region of a display device according to a fifth embodiment.
Figure 9B:
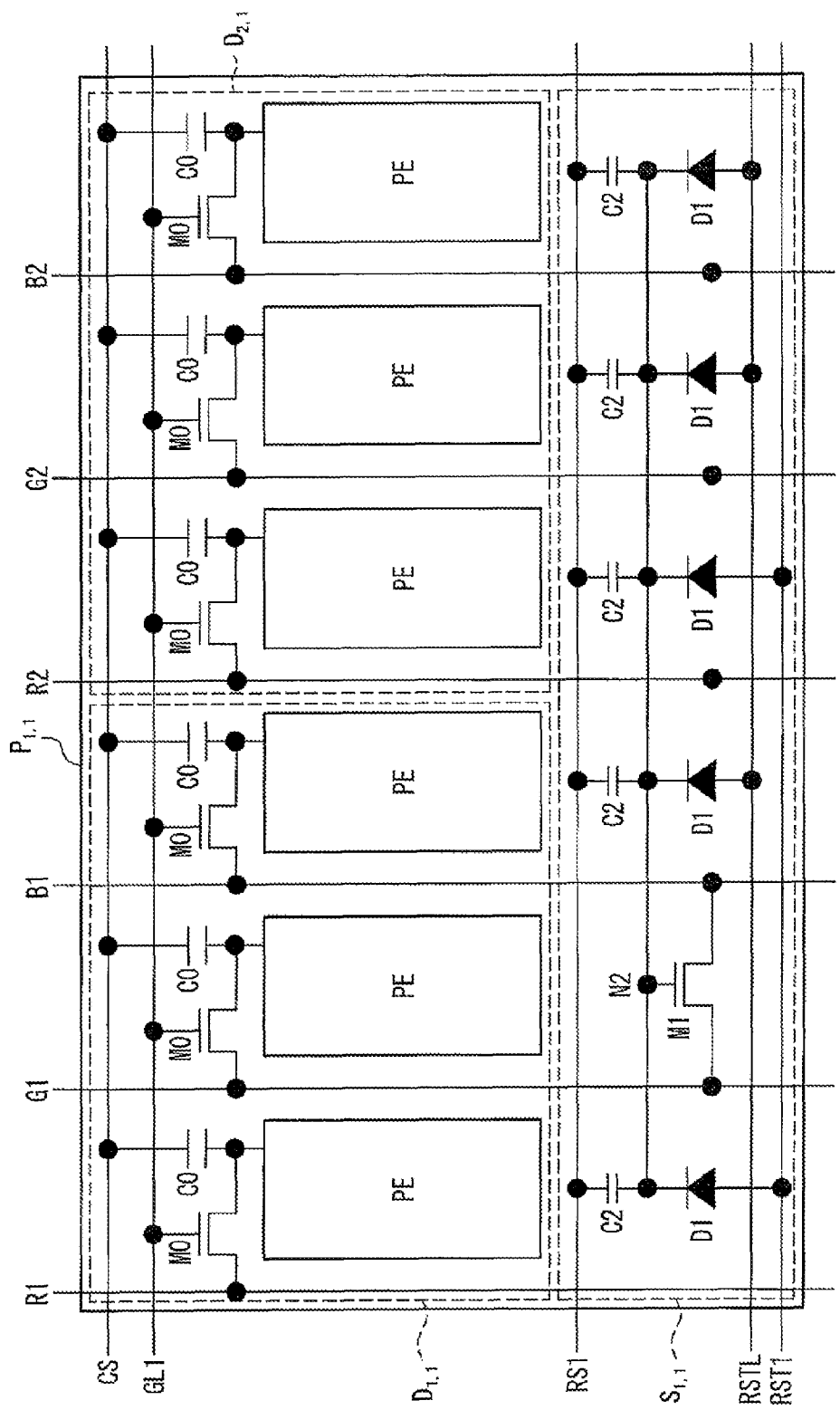
FIG. 9B is a circuit diagram showing a configuration of a pixel of the display device according to the fifth embodiment.
Figure 9C:
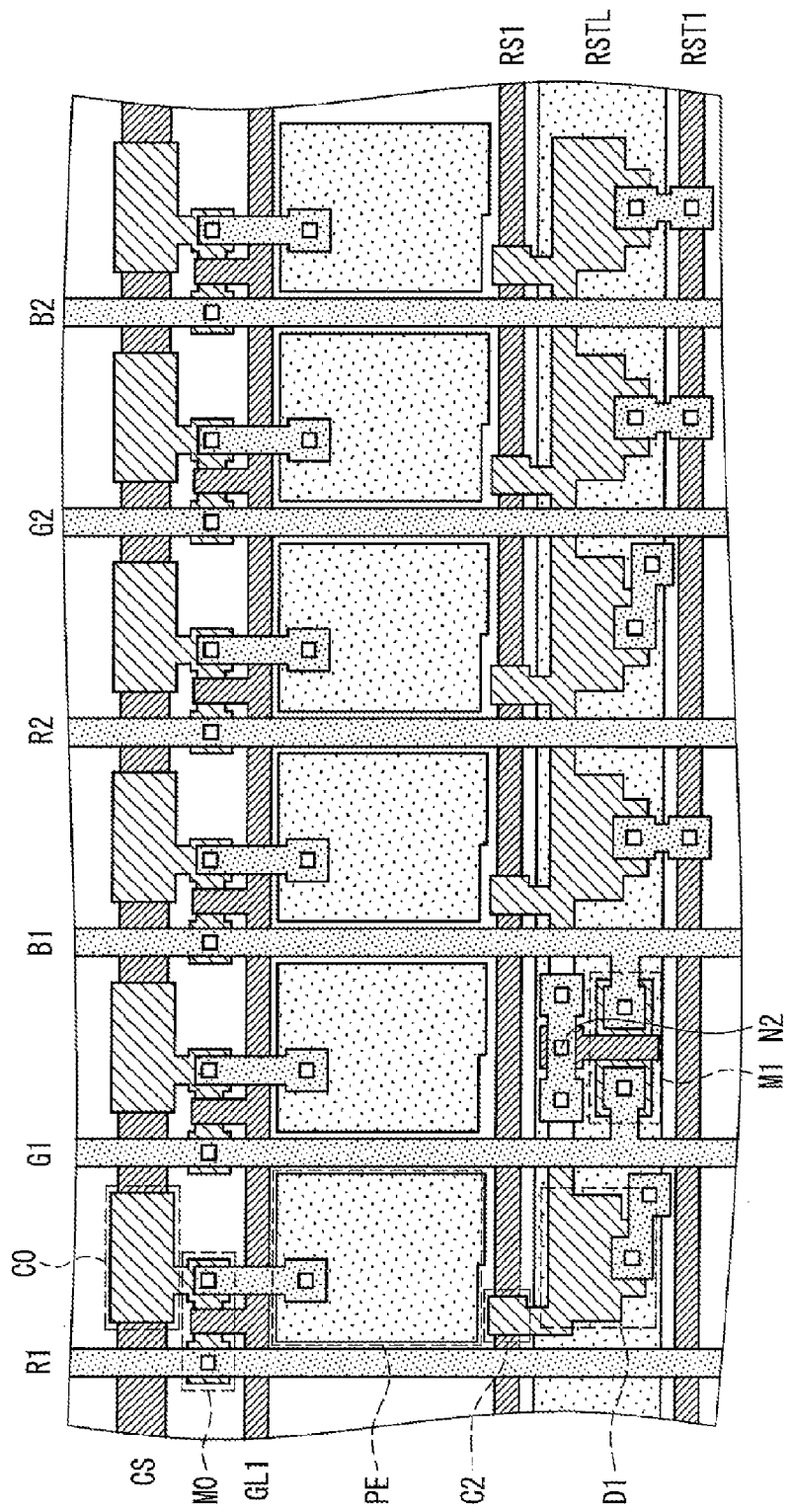
FIG. 9C is a plan view showing a layout of elements in the pixel of the display device according to the fifth embodiment.

The following describes the configuration of a liquid crystal display device including photosensors according to a fifth embodiment, with reference to FIGS. 9A to 9C.

FIG. 9A is a plan view showing the schematic configuration of the pixel region 1, and shows the arrangement relationship between display portions $D_{2i-1,k}$ and $D_{2i,k}$ and the photosensor portions $S_{i,k}$ in the pixel blocks $P_{i,k}$. In the present embodiment, similarly to the fourth embodiment, each pixel block $P_{i,k}$ (i=1 to m, k=1 to n) has two display portions $D_{2i-1,k}$ and $D_{2i,k}$ and one photosensor portion $S_{i,k}$. In other words, in the pixel region 1, 2m display portions are disposed in the horizontal direction, and n display portions are disposed in the vertical direction. Accordingly, the resolution of the liquid crystal display device is 2m×n.

FIG. 9B shows the specific configuration of the pixel block $P_{1,1}$, which is a unit pixel of the pixel region 1 in FIG. 9A. The configuration of the display portions $D_{1,1}$ and $D_{2,1}$ is similar to that in the second embodiment. In the present embodiment, the one photosensor portion $S_{1,1}$ is disposed for the two display portions $D_{1,1}$ and $D_{2,1}$. The photosensor portion $S_{1,1}$ includes five photodiodes D1 having the same performance, five storage capacitors C2 having the same capacitance, and one MOS transistor M1.

The cathodes of the five photodiodes D1 are each connected to the storage node N2. Furthermore, the first terminals of the five storage capacitors C2 and the gate of the MOS transistor M1 are connected to the storage node N2. Among the five photodiodes D1, the anodes of two photodiodes D1 (the photodiode D1 on the left end and the third photodiode D1 from the left end in FIG. 9B) are connected to the reset control line RST1. The anodes of the other three photodiodes D1 are connected to the reverse biased voltage supply line RSTL. The second terminals of the five storage capacitors C2 are each connected to the readout control line RS1.

The source of the MOS transistor M1 is connected to the data line G1 of the display portion $D_{1,1}$, and the drain is connected to the data line B1 of the display portion $D_{1,1}$. Accordingly, the data line G1 also serves as wiring for the supply of the constant voltage VDD from the sensor column driver 4 to the MOS transistor M1. Also, the data line B1 also serves as the signal readout line SL in FIG. 1.

FIG. 9C shows the layout of the various elements in the case where the pixel block $P_{1,1}$ shown in FIG. 9B is formed on a glass substrate by a semiconductor process. The reference signs of the elements correspond to the elements in the circuit diagram of FIG. 9B.

<Photosensor Portion Operations>

The operations of the photosensor portion $S_{1,1}$ having the above-described configuration are basically the same as the operations of the photosensor portion $S_{1,1}$ in the second embodiment described with reference to FIG. 6. Note that in the present embodiment, the five photodiodes D1 and the five storage capacitors C2 are used, and two of the photodiodes D1 are connected to the reset control line RST1. For this reason, the expressions representing the capacitance $C_{N2}$ of the storage node N2, the potential $V_{N2}0$ of the storage node N2, and the like are different from those of the second embodiment, as described below.

Specifically, the capacitance $C_{N2}$ of the storage node N2 is represented by the following expression.

$$C_{N2}=5C_{D1}+C_{M1}+5C_2$$

(1) The potential $V_{N2}0$ of the storage node N2 is represented by the following expression as a result of the voltage drop $V_{FD}$ due to feedthrough.

$$V_{N2}0=V_{RST}H-2C_{D1}/C_{N2}\times V_{RST}$$

(2) In the storage period, when the charge generated in one of the photodiodes D1 is the minimum value Qmin and when it is the maximum value Qmax, the potentials $V_{N2}1$ and $V_{N2}2$ of the storage node N2 are represented by the following expressions.

In the case of the minimum value Qmin, $V_{N2}1=V_{N2}0-5Qmin/C_{N2}$

In the case of the maximum value Qmax, $V_{N2}2=V_{N2}0-5Qmax/C_{N2}$ (3) The potentials $V_{G2}H$ (in the case of Qmin) and $V_{G2}L$ (in the case of Qmax) of the storage node N2 reached due to being thrust upward by the application of high level $V_{RS}H$ of the readout signal are represented by the following expressions.

$$V_{G2}H = V_{N2}1 + 5C_2/C_{N2} \times V_{RS}$$
$$= V_{RST}H - 2C_{D1}/C_{N2} \times V_{RST} - 5Qmin/C_{N2} + 5C_2/C_{N2} \times V_{RS}$$

$$V_{G2}L = V_{N2}2 + 5C_2/C_{N2} \times V_{RS}$$
$$= V_{RST}H - 2C_{DS}/C_{N2} \times V_{RST} - 5Qmax/C_{N2} + 5C_2/C_{N2} \times V_{RS}$$

Also, the expressions representing the sensor sensitivity and the sensor sensitivity improvement rate are also easily obtained by modifying the expressions in the case of the second embodiment according to the above-described differences in values, but a description of this will not particularly be given.

An advantage of the configuration of the present embodiment is that since two of the photodiodes D1 are connected to the reset control line RST1, resetting performance is improved, and resetting can be performed in a short time period.

Sixth Embodiment

Figure 10A:
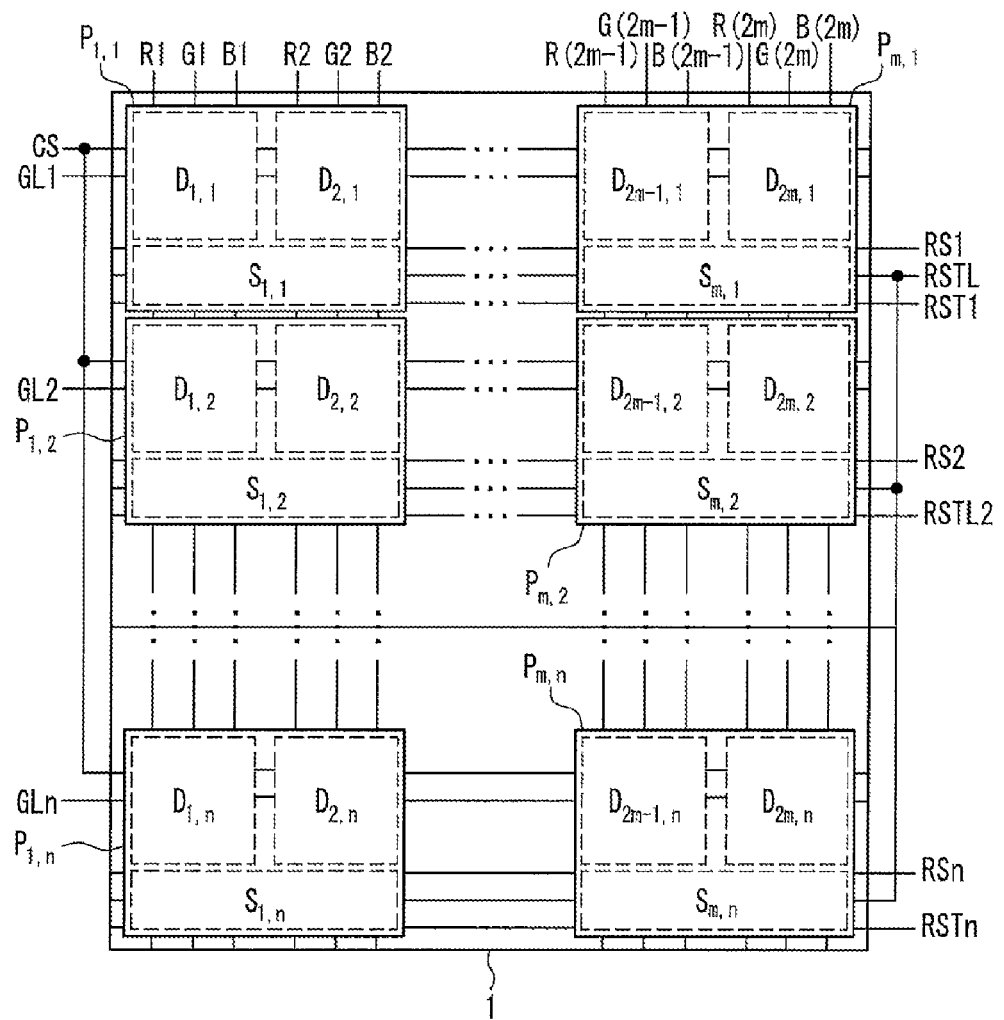
FIG. 10A is a schematic configuration diagram showing a configuration of a pixel region of a display device according to a sixth embodiment.
Figure 10B:
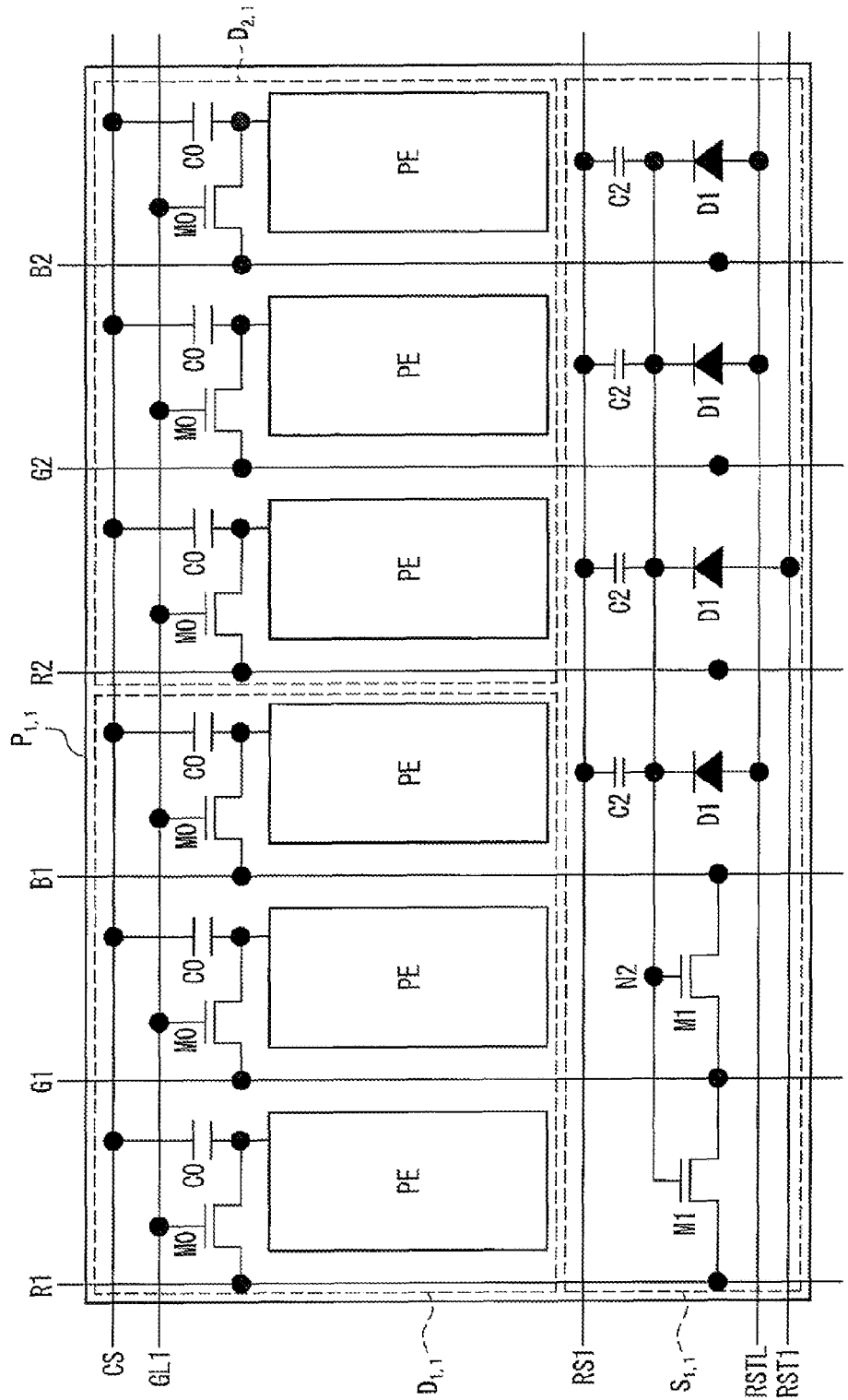
FIG. 10B is a circuit diagram showing a configuration of a pixel of the display device according to the sixth embodiment.
Figure 10C:
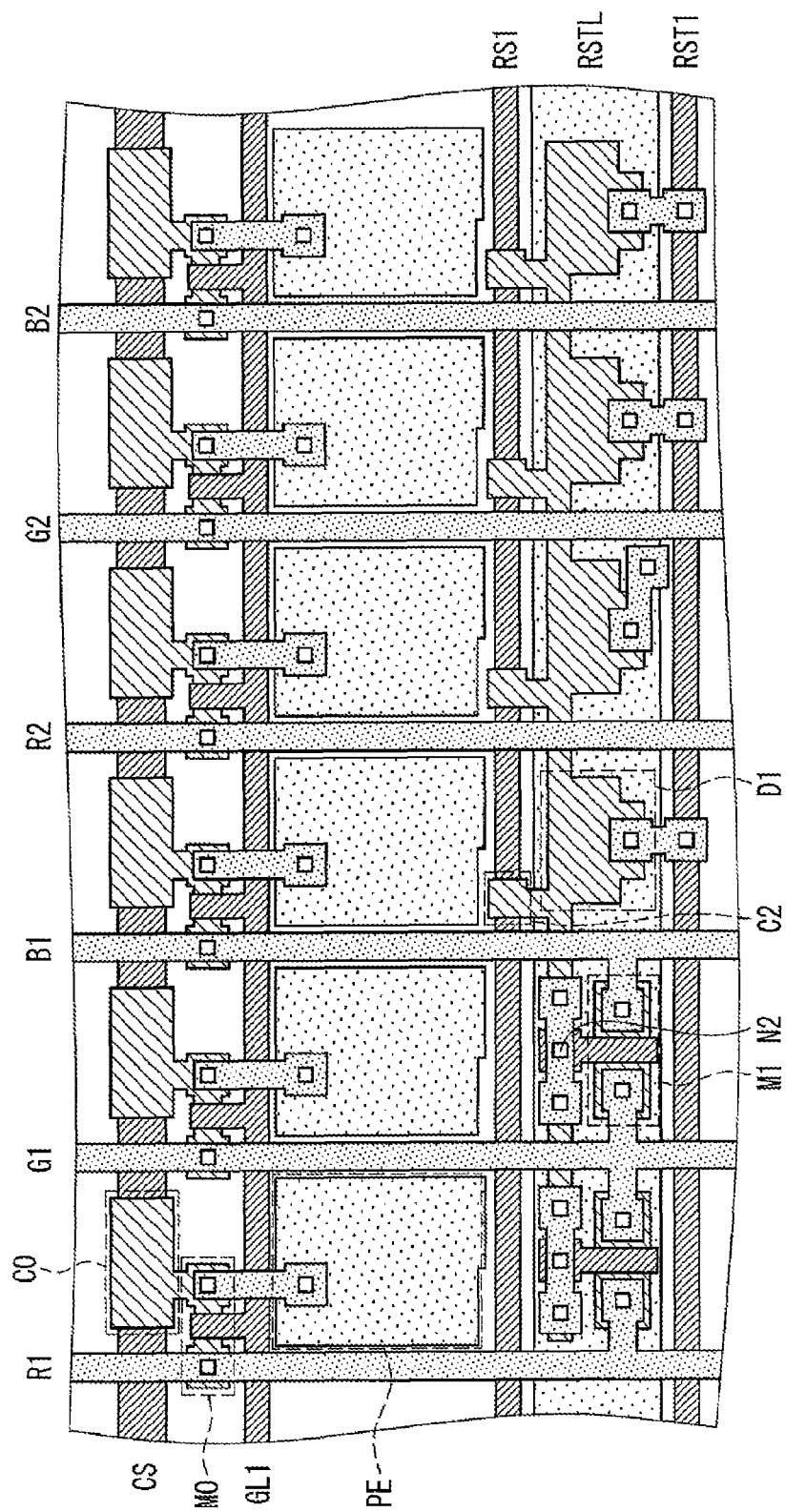
FIG. 10C is a plan view showing a layout of elements in the pixel of the display device according to the sixth embodiment.

The following describes the configuration of a liquid crystal display device including photosensors according to a sixth embodiment, with reference to FIGS. 10A to 10C.

FIG. 10A is a plan view showing the schematic configuration of the pixel region 1, and shows the arrangement relationship between display portions $D_{2-1,k}$ and $D_{2i,k}$ and the photosensor portions $S_{i,k}$ in the pixel blocks $P_{i,k}$. In the present embodiment, similarly to the fourth embodiment, each pixel block $P_{i,k}$ (i=1 to m, k=1 to n) includes two display portions $D_{2i-1,k}$ and $D_{2i,k}$ and one photosensor portion $S_{i,k}$. In other words, in the pixel region 1, 2m display portions are disposed in the horizontal direction, and n display portions are disposed in the vertical direction. Accordingly, the resolution of the liquid crystal display device is 2m×n.

FIG. 10B shows the specific configuration of the pixel block $P_{1,1}$, which is a unit pixel of the pixel region 1 in FIG. 10A. The configuration of the display portions $D_{1,1}$ and $D_{2,1}$ is similar to that in the second embodiment. In the present embodiment, the one photosensor portion $S_{1,1}$ is disposed for the two display portions $D_{1,1}$ and $D_{2,1}$. The photosensor portion $S_{1,1}$ includes four photodiodes D1 having the same performance, four storage capacitors C2 having the same capacitance, and two MOS transistors M1.

The cathodes of the four photodiodes D1 are each connected to the storage node N2. Furthermore, the first terminals of the four storage capacitors C2 and the gates of the two MOS transistors M1 are connected to the storage node N2. Among the four photodiodes D1, the anode of one photodiode D1 (the second photodiode D1 from the left end in FIG. 10B) is connected to the reset control line RST1. The anodes of the other three photodiodes D1 are connected to the reverse biased voltage supply line RSTL. The second terminals of the four storage capacitors C2 are each connected to the readout control line RS1.

The sources of the two MOS transistors M1 are respectively connected to the data lines R1 and B1 of the display portion $D_{1,1}$, and the drains are connected to the data line G1 of the display portion $D_{1,1}$. Accordingly, the data lines R1 and B1 also serve as wiring for the supply of the constant voltage VDD to the MOS transistors M1. Also, the data line G1 also serves as the signal readout line SL in FIG. 1.

FIG. 10C shows the layout of the various elements in the case where the pixel block $P_{1,1}$ shown in FIG. 10B is formed on a glass substrate by a semiconductor process. The reference signs of the elements correspond to the elements in the circuit diagram of FIG. 10B.

<Photosensor Portion Operations>

The operations of the photosensor portion $S_{1,1}$ having this configuration are basically the same as the operations of the photosensor portion $S_{1,1}$ in the second embodiment described with reference to FIG. 6. Note that in the present embodiment, the four photodiodes D1, the four storage capacitors C2, and the two MOS transistors M1 are used. For this reason, the expressions representing the capacitance $C_{N2}$ of the storage node N2, the potential $V_{N2}0$ of the storage node N2, and the like are different from those of the second embodiment, as described below.

Specifically, the capacitance $C_{N2}$ of the storage node N2 is represented by the following expression.

$$C_{N2} = 4C_{D1} + 2C_{M1} + 4C_2$$

(1) The potential $V_{N2}0$ of the storage node N2 is represented by the following expression as a result of the voltage drop $V_{FD}$ due to feedthrough.

$$V_{N2}0 = V_{RST}H - C_{D1}/C_{N2} \times V_{RST}$$

(2) In the storage period, when the charge generated in one of the photodiodes D1 is the minimum value Qmin and when it is the maximum value Qmax, the potentials $V_{N2}1$ and $V_{N2}2$ of the storage node N2 are represented by the following expressions.

In the case of the minimum value Qmin, $V_{N2}1 = V_{N2}0 - 4Qmin/C_{N2}$

In the case of the maximum value Qmax, $V_{N2}2 = V_{N2}0 - 4Qmax/C_{N2}$ (3) The potentials $V_{G2}H$ (in the case of Qmin) and $V_{G2}L$ (in the case of Qmax) of the storage node N2 reached due to being thrust upward by the application of high level $V_{RS}H$ of the readout signal are represented by the following expressions.

$$V_{G2}H = V_{N2}1 + 4C_2/C_{N2} \times V_{RS}$$
$$= V_{RST}H - C_{D1}/C_{N2} \times V_{RST} - 4Qmin/C_{N2} + 4C_2/C_{N2} \times V_{RS}$$

$$V_{G2}L = V_{N2}2 + 4C_2/C_{N2} \times V_{RS}$$
$$= V_{RST}H - C_{DS}/C_{N2} \times V_{RST} - 4Qmax/C_{N2} + 4C_2/C_{N2} \times V_{RS}$$

Also, the expressions representing the sensor sensitivity and the sensor sensitivity improvement rate are also easily obtained by modifying the expressions in the case of the second embodiment according to the above-described differences in values, but a description of this will not particularly be given.

An advantage of the configuration of the present embodiment is that since two MOS transistors M1 for the readout of sensor output are used, the readout time can be shortened.

Seventh Embodiment

Figure 11A:
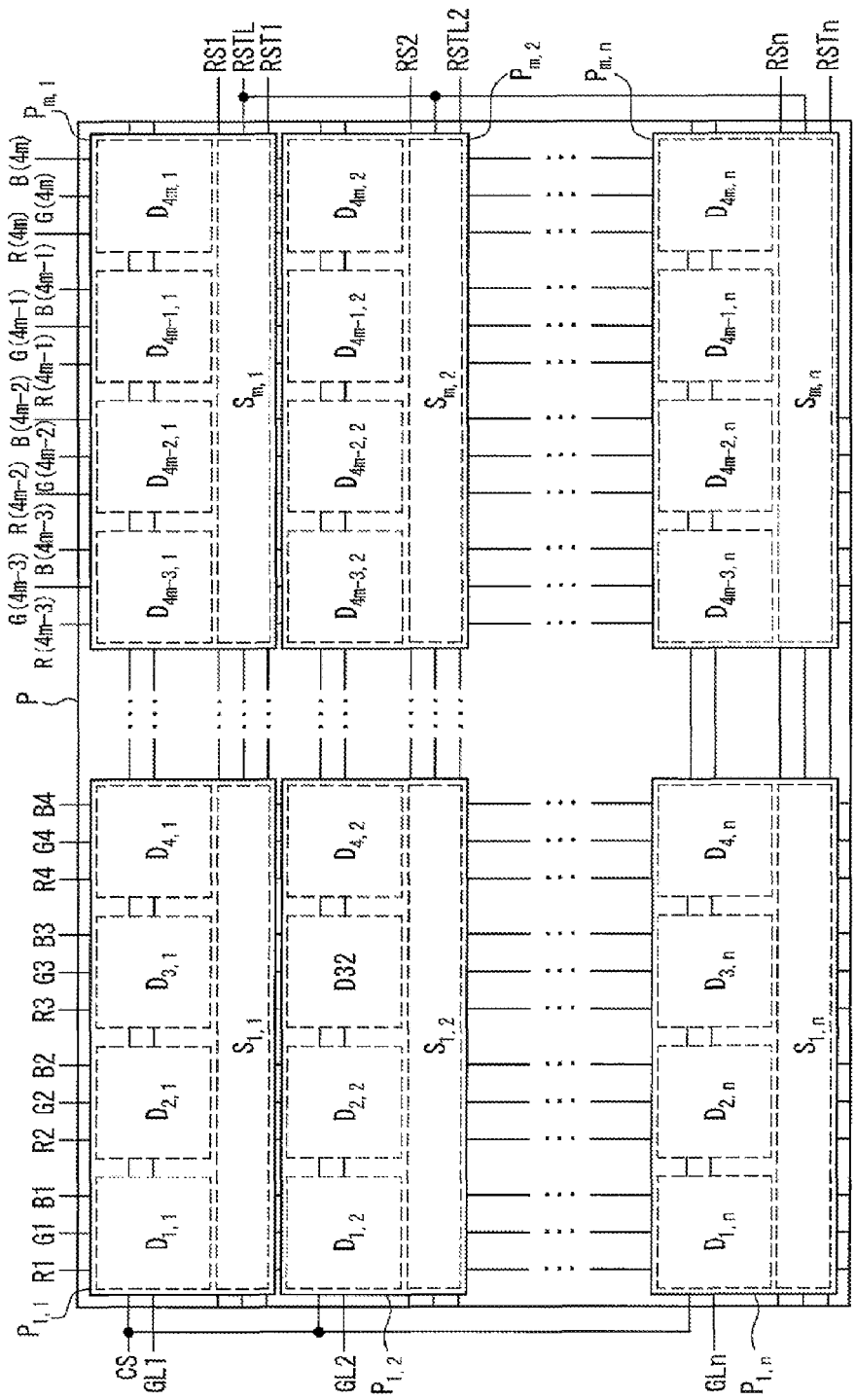
FIG. 11A is a schematic configuration diagram showing a configuration of a pixel region of a display device according to a seventh embodiment.
Figure 11B:
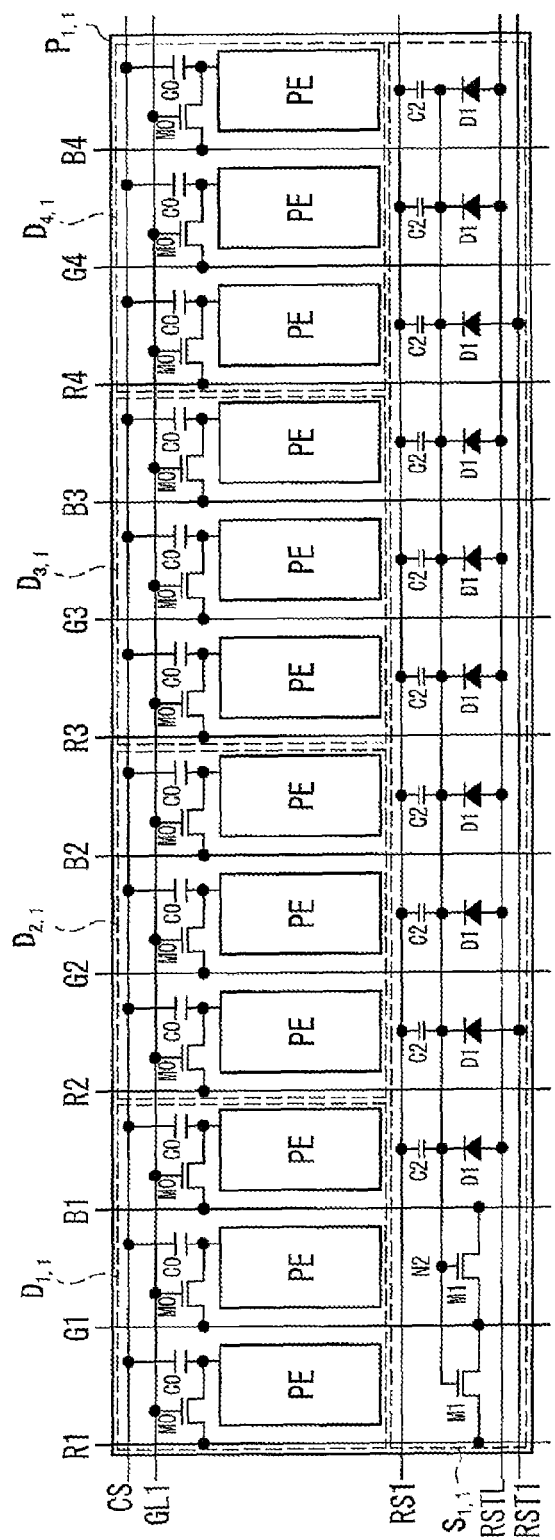
FIG. 11B is a circuit diagram showing a configuration of a pixel of the display device according to the seventh embodiment.
Figure 11C:
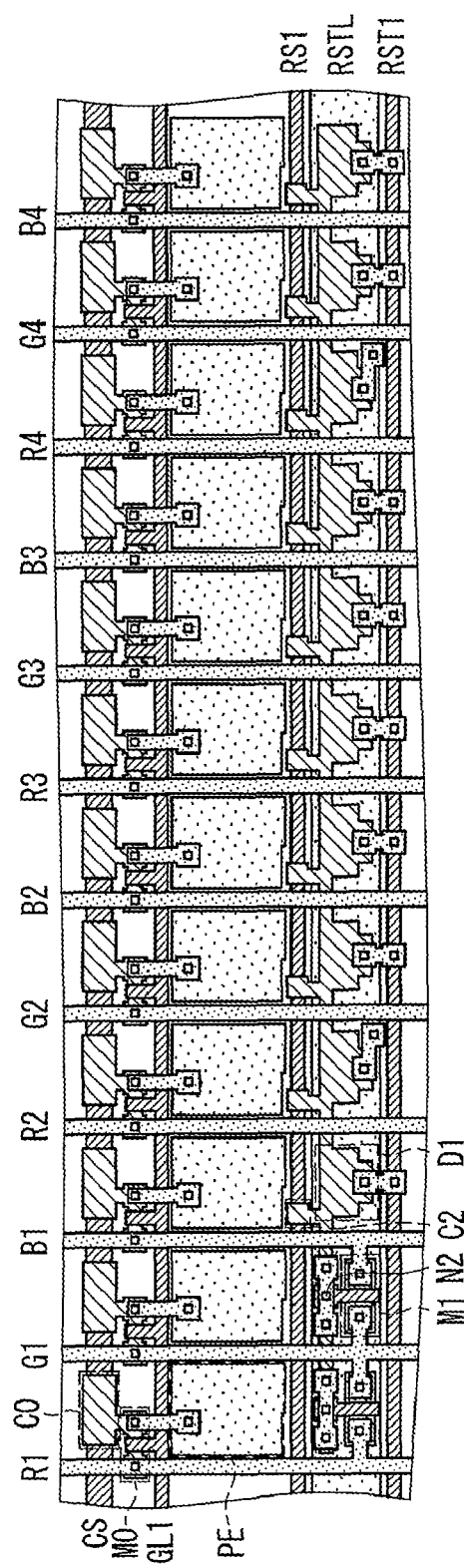
FIG. 11C is a plan view showing a layout of elements in the pixel of the display device according to the seventh embodiment.

The following describes the configuration of a liquid crystal display device including photosensors according to a seventh embodiment, with reference to FIGS. 11A to 11C.

FIG. 11A is a plan view showing the schematic configuration of the pixel region 1, and shows the arrangement relationship between display portions $D_{4i-3,k}$, $D_{4i-2,k}$, $D_{4i-1,k}$, $D_{4i,k}$, and $D_{4i,k}$ and the photosensor portions $S_{i,k}$ in the pixel blocks $P_{i,k}$. In the present embodiment, each pixel block $P_{i,k}$ (i=1 to m, k=1 to n) has four display portions $D_{4i-3,k}$, $D_{4i-2,k}$, $D_{4i-1,k}$, $D_{4i,k}$ and one photosensor portion $S_{i,k}$. In other words, in the pixel region 1, 4m display portions are disposed in the horizontal direction, and n display portions are disposed in the vertical direction. Accordingly, the resolution of the liquid crystal display device is 4m×n.

FIG. 11B shows the specific configuration of the pixel block $P_{1,1}$, which is a unit pixel of the pixel region 1 in FIG. 11A. The configuration of the display portions $D_{1,1}$, $D_{2,1}$, $D_{3,1}$, and $D_{4,1}$ is similar to that in the second embodiment. In the present embodiment, the one photosensor portion $S_{1,1}$ is disposed for the four display portions $D_{1,1}$, $D_{2,1}$, $D_{3,1}$, and $D_{4,1}$. The photosensor portion $S_{1,1}$ includes ten photodiodes D1 having the same performance, ten storage capacitors C2 having the same capacitance, and two MOS transistors M1.

The cathodes of the ten photodiodes D1 are each connected to the storage node N2. Furthermore, the first terminals of the ten storage capacitors C2 and the gates of the two MOS transistors M1 are connected to the storage node N2. Among the ten photodiodes D1, the anodes of two photodiodes D1 (the second photodiode D1 from the left end and the second photodiode D1 from the right end in FIG. 11B) are connected to the reset control line RST1. The anodes of the other eight photodiodes D1 are connected to the reverse biased voltage supply line RSTL. The second terminals of the ten storage capacitors C2 are each connected to the readout control line RS1.

The sources of the two MOS transistors M1 are respectively connected to the data lines R1 and B1 of the display portion $D_{1,1}$, and the drains are connected to the data line G1 of the display portion $D_{1,1}$. Accordingly, the data lines R1 and B1 also serve as wiring for the supply of the constant voltage VDD to the MOS transistors M1. Also, the data line G1 also serves as the signal readout line SL in FIG. 1.

FIG. 11C shows the layout of the various elements in the case where the pixel block $P_{1,1}$ shown in FIG. 11B is formed on a glass substrate by a semiconductor process. The reference signs of the elements correspond to the elements in the circuit diagram of FIG. 11B.

<Photosensor Portion Operations>

The operations of the photosensor portion $S_{1,1}$ having the above-described configuration are basically the same as the operations of the photosensor portion $S_{1,1}$ in the second embodiment described with reference to FIG. 6. Note that in the present embodiment, the ten photodiodes D1, the ten storage capacitors C2, and the two MOS transistors M1 are used. For this reason, the expressions representing the capacitance $C_{N2}$ of the storage node N2, the potential $V_{N2}0$ of the storage node N2, and the like are different from those of the second embodiment, as described below.

Specifically, the capacitance $C_{N2}$ of the storage node N2 is represented by the following expression.

$$C_{N2} = 10C_{D1} + 2C_{M1} + 10C_2$$

(1) The potential $V_{N2}0$ of the storage node N2 is represented by the following expression as a result of the voltage drop $V_{FD}$ due to feedthrough.

$$V_{N2}0 = V_{RST}H - 2C_{D1}/C_{N2} \times V_{RST}$$

(2) In the storage period, when the charge generated in one of the photodiodes D1 is the minimum value Qmin and when it is the maximum value Qmax, the potentials $V_{N2}1$ and $V_{N2}2$ of the storage node N2 are represented by the following expressions.

In the case of the minimum value Qmin, $V_{N2}1 = V_{N2}0 - 10Q\text{min}/C_{N2}$ In the case of the maximum value Qmax, $V_{N2}2 = V_{N2}0 - 10Q\text{max}/C_{N2}$ (3) The potentials $V_{G2}H$ (in the case of Qmin) and $V_{G2}L$ (in the case of Qmax) of the storage node N2 reached due to being thrust upward by the application of high level $V_{RS}H$ of the readout signal are represented by the following expressions.

$$\begin{aligned}V_{G2}H &= V_{N2}1 + 10C_2/C_{N2} \times V_{RS} \\ &= V_{RST}H - 2C_{D1}/C_{N2} \times V_{RST} - 10Q\text{min}/C_{N2} + \\ &\quad 10C_2/C_{N2} \times V_{RS}\end{aligned}$$

$$\begin{aligned}V_{G2}L &= V_{N2}2 + 4C_2/C_{N2} \times V_{RS} \\ &= V_{RST}H - 2C_{DS}/C_{N2} \times V_{RST} - 10Q\text{max}/C_{N2} + \\ &\quad 10C_2/C_{N2} \times V_{RS}\end{aligned}$$

Also, the expressions representing the sensor sensitivity and the sensor sensitivity improvement rate are also easily obtained by modifying the expressions in the case of the second embodiment according to the above-described differences in values, but a description of this will not particularly be given.

Other Embodiments, Etc.

Note that although examples of configurations in which a display device according to an embodiment of the present invention is implemented as a liquid crystal display device are described in the above first to seventh embodiments, the display device according to an embodiment of the present invention is not limited to a liquid crystal display device, and is applicable to an arbitrary display device that uses an active matrix substrate. It should also be noted that due to having a photosensor, the display device according to an embodiment of the present invention is envisioned to be used as, for example, a display device with a touch panel that performs input operations by detecting an object that has come close to the screen, or a bidirectional communication display device that is equipped with a display function and an image capture function.

Also, the photosensor according to an embodiment of the present invention is not limited to being applied to a display device equipped with a photosensor, and can also be applied to, for example, another device such as an image scanner. Also, the configuration of the photosensor is also not limited to that in the first to seventh embodiments.

An embodiment of the present invention can be applied to a photosensor configured such that the potential of a storage node is reset by a reset control line via a photodiode. Also, the reset signal is not limited to a form according to which the pulse voltage rises from low level to high level at the start of the reset period, and a form is possible in which the reset period starts due to a drop from high level to low level. In this case, a form is preferable in which the photodiodes are connected such that the potential of the storage node rises in accordance with the photocurrent.

INDUSTRIAL APPLICABILITY

The present invention enables reducing the capacitance of a storage capacitor and improving the sensor sensitivity, and is useful as, for example, a photosensor provided in the pixel region of a display device.

The invention claimed is:

1. A photosensor comprising:
a first photodiode and a second photodiode;
a storage node to which cathodes of the first and second photodiodes are connected;
a storage capacitor, a first terminal of which is connected to the storage node; and
a MOS transistor, a gate of which is connected to the storage node, that outputs a signal in accordance with the potential of the storage node,
wherein, a forward biased pulse voltage is supplied to an anode of the first photodiode in a reset period, and a reverse biased voltage is supplied to the anode of the first photodiode in a storage period and a readout period,
a reverse biased voltage is supplied to an anode of the second photodiode in all operation periods, and
a voltage that holds the potential of the storage node in a range less than a threshold value of the MOS transistor is supplied to a second terminal of the storage capacitor in the reset period and the storage period, and a voltage that thrusts the potential of the storage node upward to a range greater than or equal to the threshold value of the MOS transistor is supplied to the second terminal of the storage capacitor in the readout period.

2. The photosensor according to claim 1, wherein a parasitic capacitance of the first photodiode is lower than that of the second photodiode.

3. The photosensor according to claim 1, wherein the reverse biased voltage supplied to the anode of the second photodiode is the same as the reverse biased voltage supplied to the anode of the first photodiode.

4. The photosensor according to claim 1, wherein the voltage supplied to the second terminal of the storage capacitor in the readout period is set such that the potential of the storage node is limited to a range in which the MOS transistor operates in a linear region.

5. The photosensor according to claim 1,
wherein the anode of the first photodiode is connected to a reset control line via which the forward biased pulse voltage is supplied in the reset period,
the anode of the second photodiode is connected to a reverse biased voltage supply line via which a reverse biased voltage is supplied in all operation periods, and
in the readout period, the second terminal of the storage capacitor is connected to a readout control line via which the voltage according to which the potential of the storage node is thrust upward to the threshold value of the MOS transistor or greater is supplied.

6. A display device comprising:
a display panel having a pixel region in which a plurality of pixel blocks are arranged; and
a driving circuit that performs signal processing for driving an element configuring the pixel region,
wherein each of the pixel blocks includes a display portion configured by a display element, and a photosensor portion for detecting incident light, and
each of the photosensor portions is configured by the photosensor according to claim 1.

7. The display device according to claim 6,
wherein each of the pixel blocks includes one display portion and one photosensor portion, and
each of the photosensor portions comprises one first photodiode, one second photodiode, one storage capacitor, and one MOS transistor.

8. The display device according to claim 6,
wherein each of the pixel blocks includes one display portion and one photosensor portion, and
each of the photosensor portions comprises one first photodiode, one second photodiode, two storage capacitors, and one MOS transistor.

9. The display device according to claim 6,
wherein each of the pixel blocks includes two display portions and one photosensor portion, and
each of the photosensor portions comprises one first photodiode, four second photodiodes, five storage capacitors, and one MOS transistor.

10. The display device according to claim 6,
wherein each of the pixel blocks includes two display portions and one photosensor portion, and
each of the photosensor portions comprises two first photodiodes, three second photodiodes, five storage capacitors, and one MOS transistor.

11. The display device according to claim 6,
wherein each of the pixel blocks includes two display portions and one photosensor portion, and
each of the photosensor portions comprises one first photodiode, three second photodiodes, four storage capacitors, and two MOS transistors.

12. The display device according to claim 6,
wherein each of the pixel blocks includes four display portions and one photosensor portion, and
each of the photosensor portions comprises two first photodiodes, eight second photodiodes, ten storage capacitors, and two MOS transistors.

13. The display device according to claim 6, wherein each of the display portions includes three primary color display elements.

* * * * *